United States Patent
Ghamsari et al.

(10) Patent No.: US 11,949,036 B2
(45) Date of Patent: Apr. 2, 2024

(54) SUPPRESSION OF PHOTOTRANSISTOR GAIN IN AN OPTICAL MODULATOR

(71) Applicant: Ciena Corporation, Hanover, MD (US)

(72) Inventors: Behnood Ghohroodi Ghamsari, Ottawa (CA); Alasdair Rankin, Ottawa (CA)

(73) Assignee: Ciena Corporation, Hanover, MD (US)

( * ) Notice: Subject to any disclaimer, the term of this patent is extended or adjusted under 35 U.S.C. 154(b) by 11 days.

(21) Appl. No.: 17/717,227

(22) Filed: Apr. 11, 2022

(65) Prior Publication Data

US 2023/0327042 A1 Oct. 12, 2023

(51) Int. Cl.
*H01L 31/11* (2006.01)
*H01L 31/0304* (2006.01)
*H01L 31/18* (2006.01)

(52) U.S. Cl.
CPC .... *H01L 31/1105* (2013.01); *H01L 31/03046* (2013.01); *H01L 31/1844* (2013.01)

(58) Field of Classification Search
CPC ........... H01L 31/1105; H01L 31/03046; H01L 31/1844
See application file for complete search history.

(56) References Cited

U.S. PATENT DOCUMENTS 8,198,638 B2 6/2012 MacElwee et al.
10,414,194 B2 9/2019 Firth et al.

| 2005/0157368 A1* | 7/2005 | Vang | B82Y 10/00 359/248 |
| 2007/0023783 A1* | 2/2007 | Hase | H01L 29/0821 257/E29.189 |
| 2020/0357933 A1* | 11/2020 | Okano | H01L 21/02 |

FOREIGN PATENT DOCUMENTS

| WO | 8403397 A1 | 8/1984 |
| WO | 8702478 A1 | 4/1987 |
| WO | 2016081476 A1 | 5/2016 |

OTHER PUBLICATIONS

Nobuhiro Kikuchi et al., "80-GB/s Low-Driving-Voltage InP DQPSK Modulator With an n-p-i-n Structure," IEEE Photonics Technology Letters, vol. 21, No. 12, Jun. 15, 2009, pp. 787-789.
Y. Ogiso et al., "[011] waveguide stripe direction n-i-p-n heterostructure InP optical modulator," Electronics Letters, vol. 50, No. 9, Apr. 24, 2014, pp. 688-690.
Yoshihiro Ogiso et al., "80-GHz Bandwidth and 1.5-V Vπ InP-Based IQ Modulator," Journal of Lightwave Technology, vol. 38, No. 2, Jan. 15, 2020, pp. 249-255.
Jul. 25, 2023, International Search Report and Written Opinion for International Patent Application No. PCT/US2023/065600.

* cited by examiner

*Primary Examiner* — Calvin Y Choi
(74) *Attorney, Agent, or Firm* — Baratta Law PLLC; Lawrence A. Baratta, Jr.

(57) ABSTRACT

An optical modulator includes an emitter layer with N-type doping having a first bandgap energy; a base layer with P-type doping having a second bandgap energy; a sub-emitter layer disposed between the emitter layer and the base layer, wherein the sub-emitter layer has a third bandgap energy that is less than both the first bandgap energy and the second bandgap energy. The sub-emitter layer provides a barrier to electrons flowing from the emitter layer, while allowing photo-generated holes to recombine in the sub-emitter layer thereby mitigating current amplification.

18 Claims, 35 Drawing Sheets

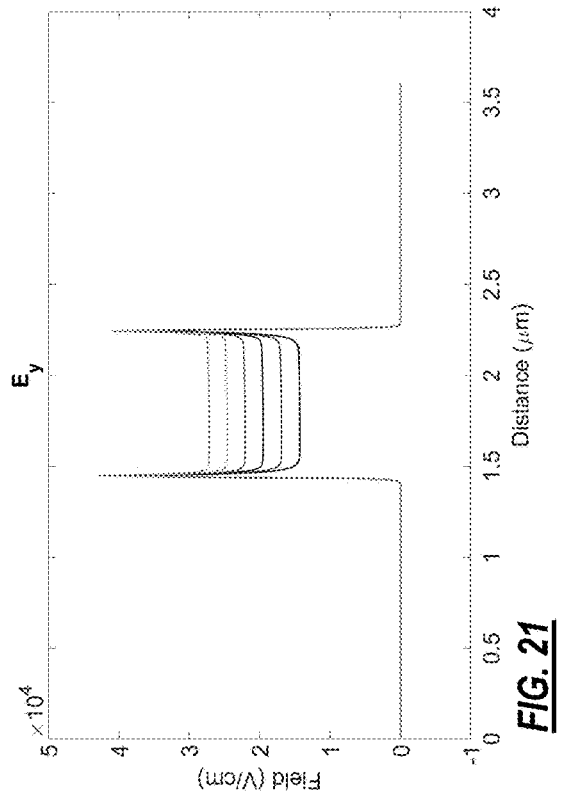
FIG. 20
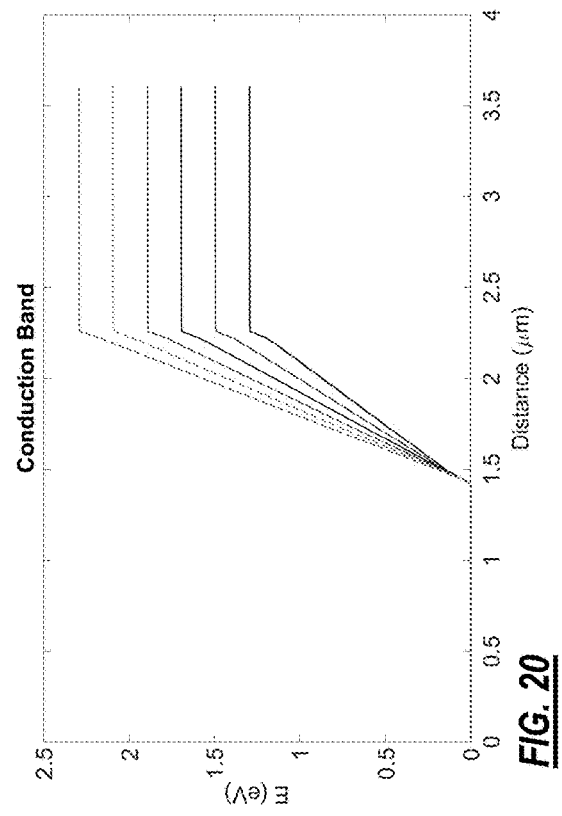
FIG. 21
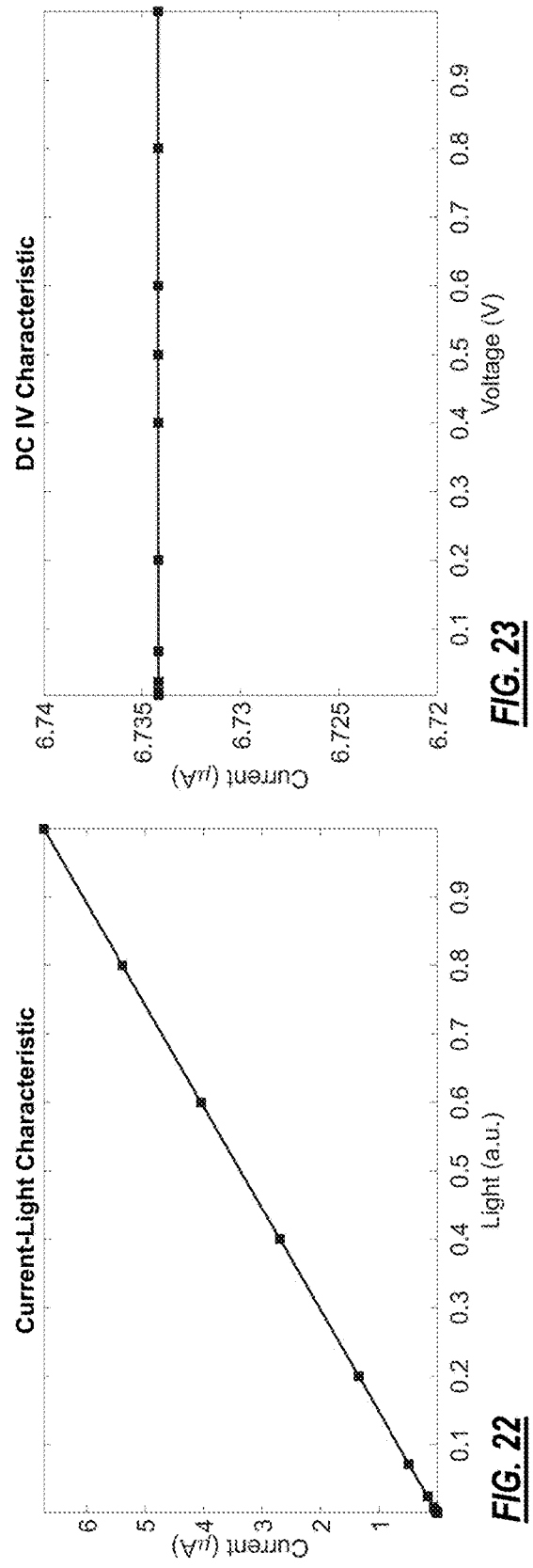
FIG. 22
FIG. 23

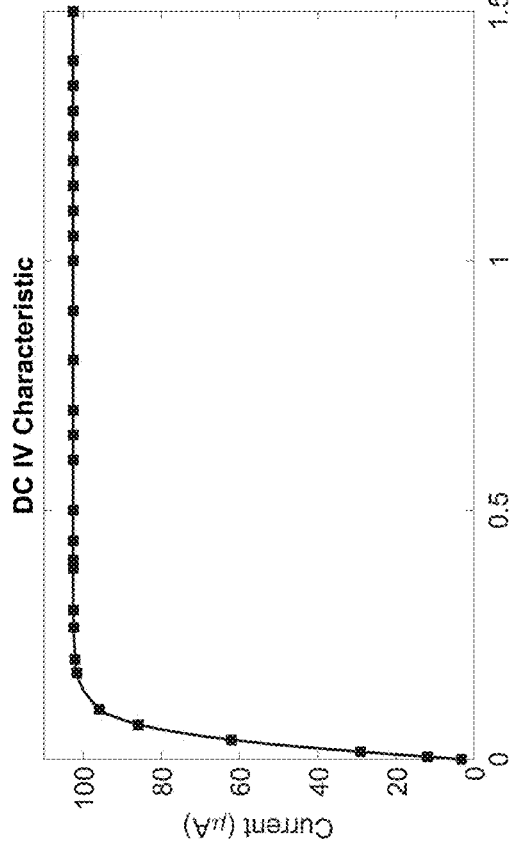
*FIG. 36*
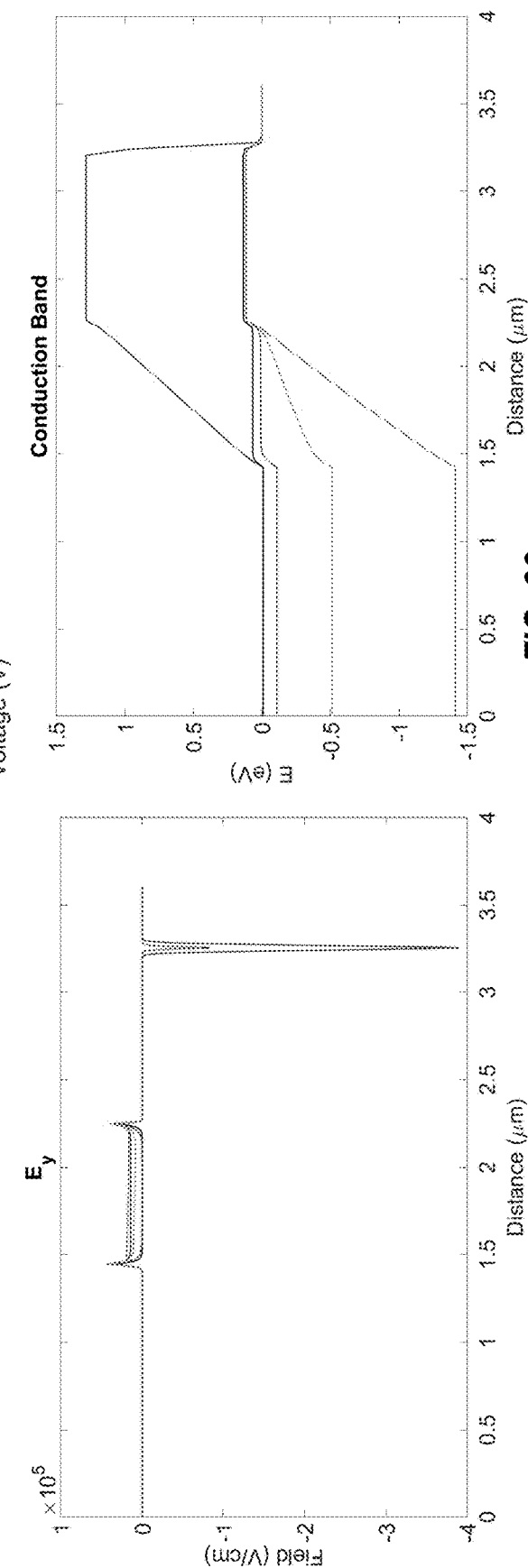
*FIG. 38*
*FIG. 37*

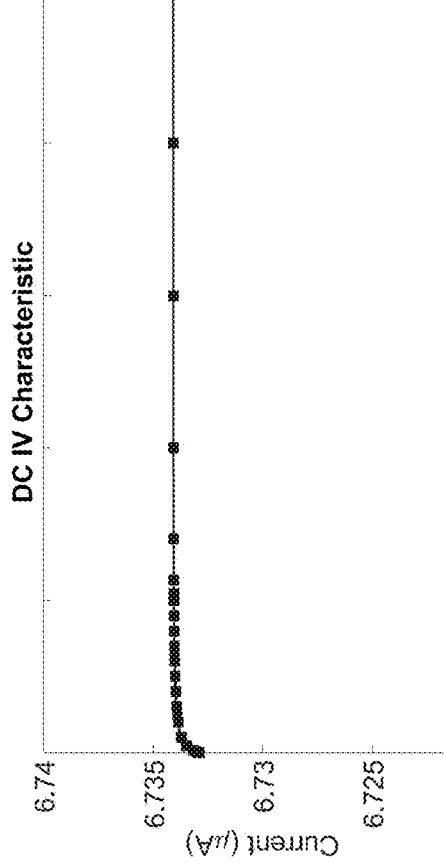
FIG. 42
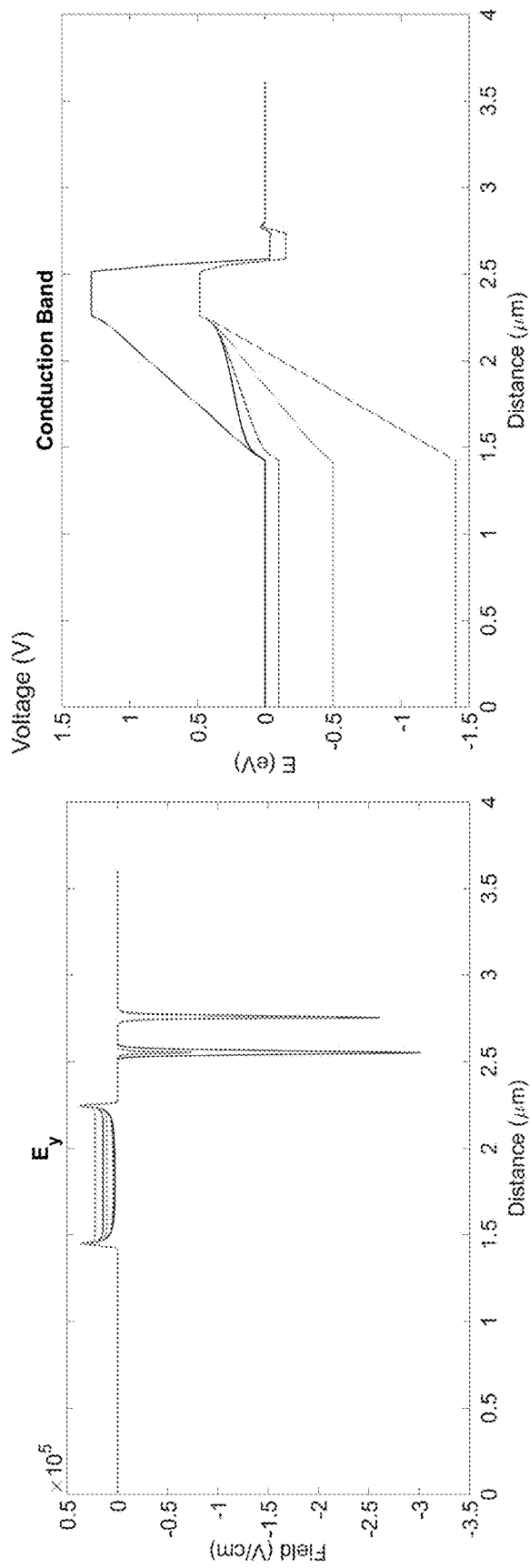
FIG. 44
FIG. 43

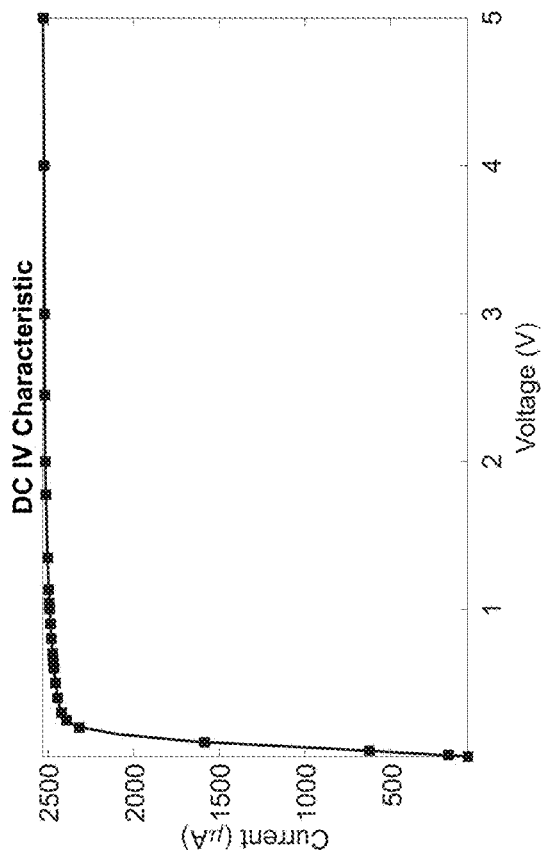
FIG. 45
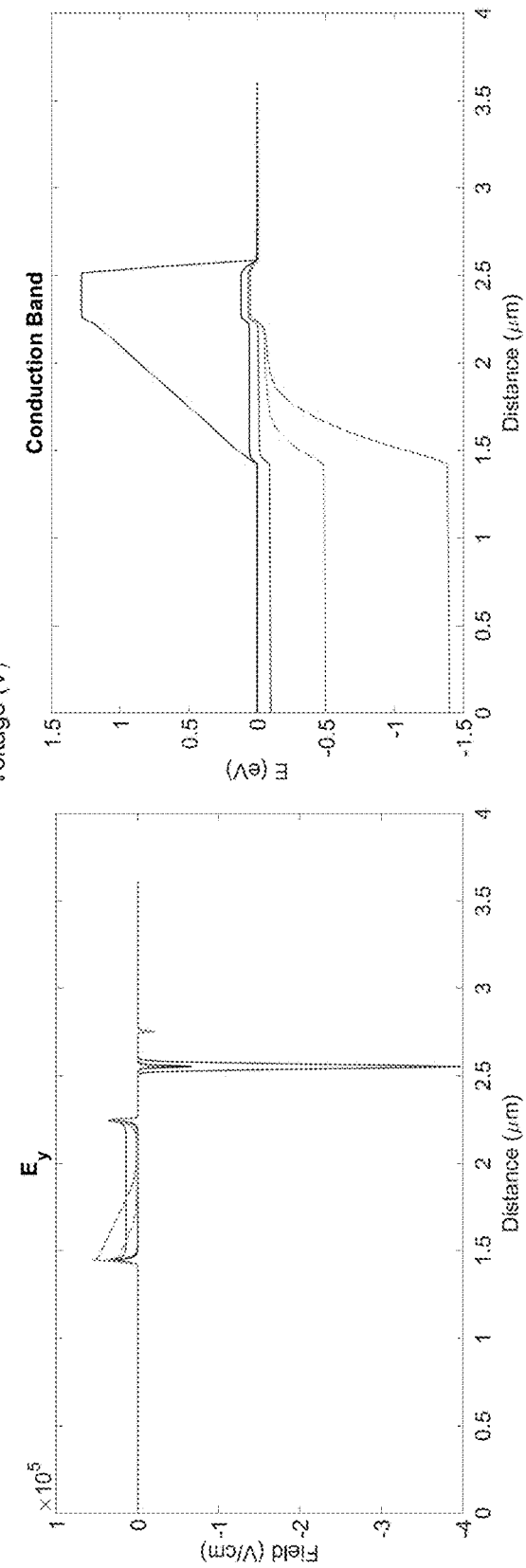
FIG. 47
FIG. 46

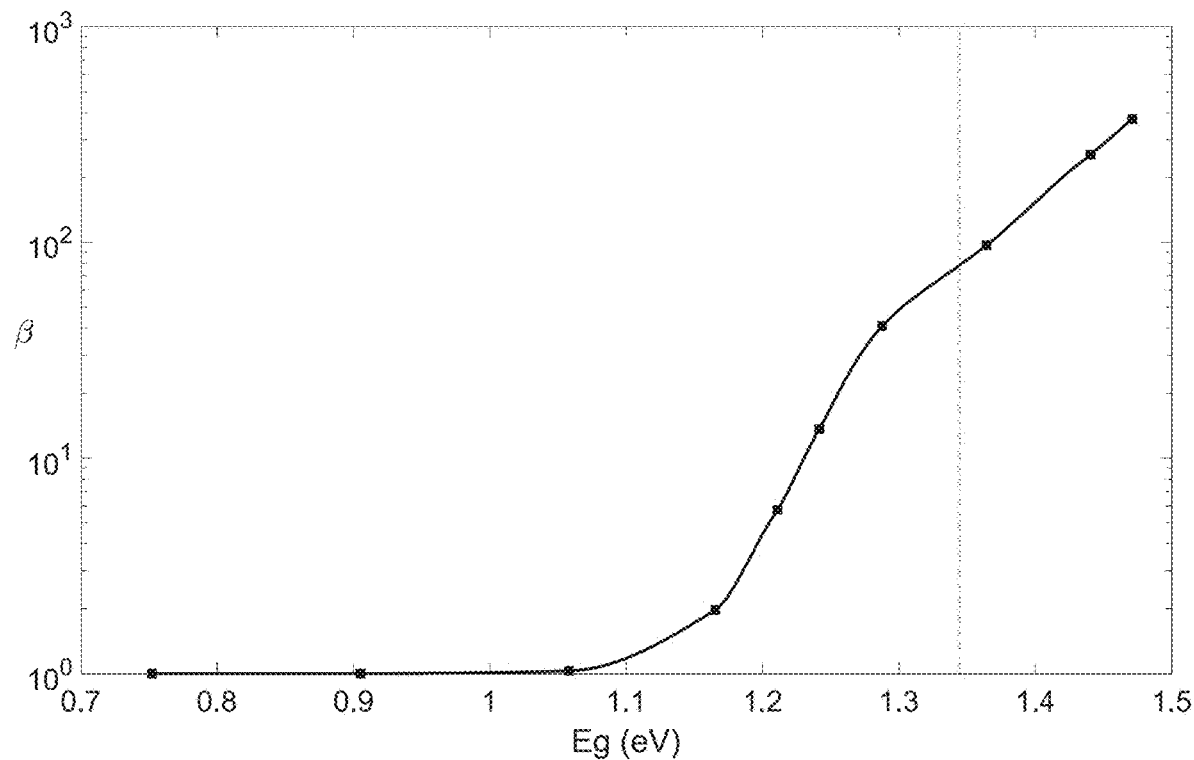
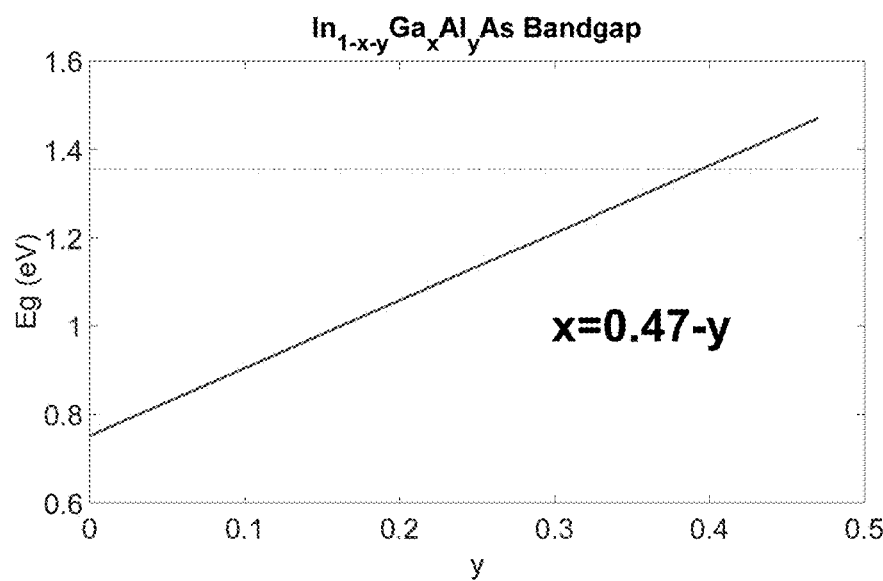
*FIG. 48*

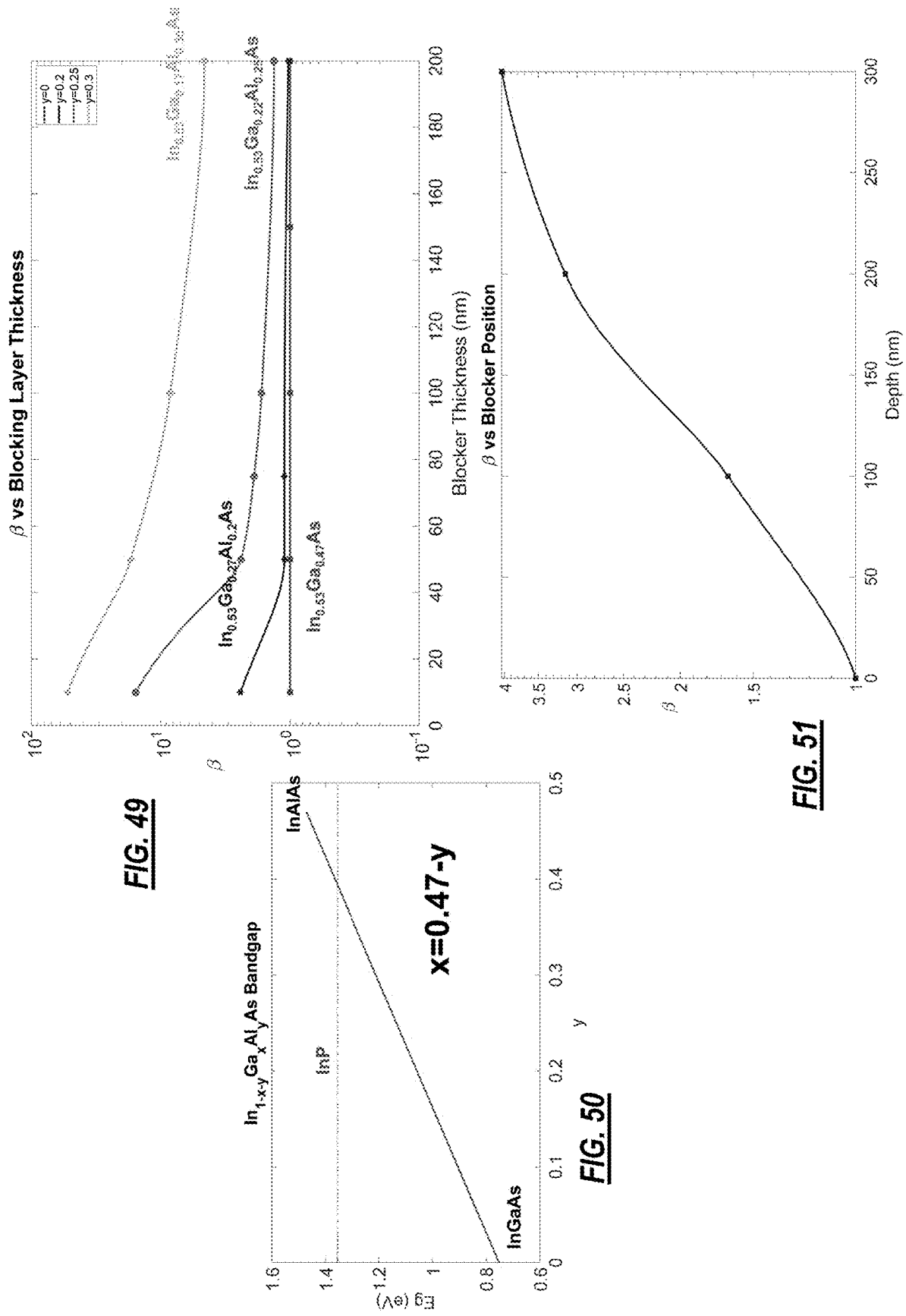

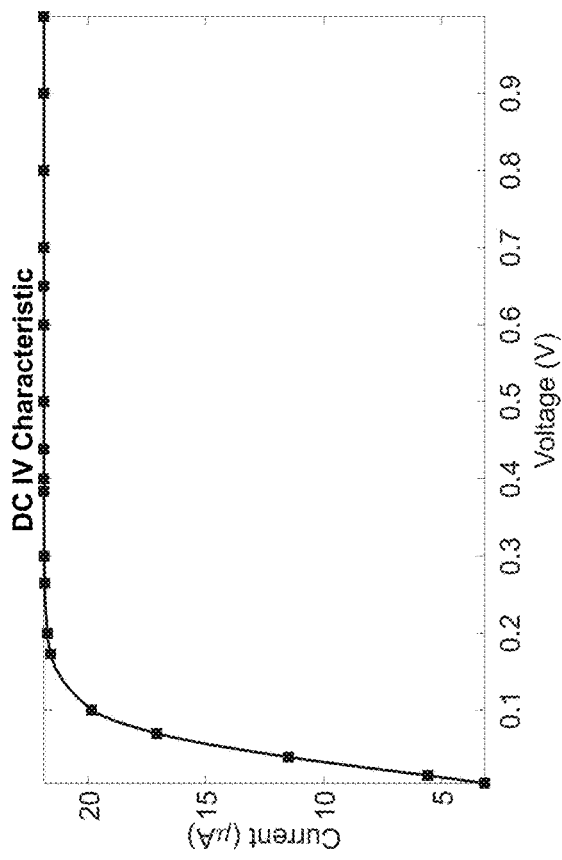
FIG. 55
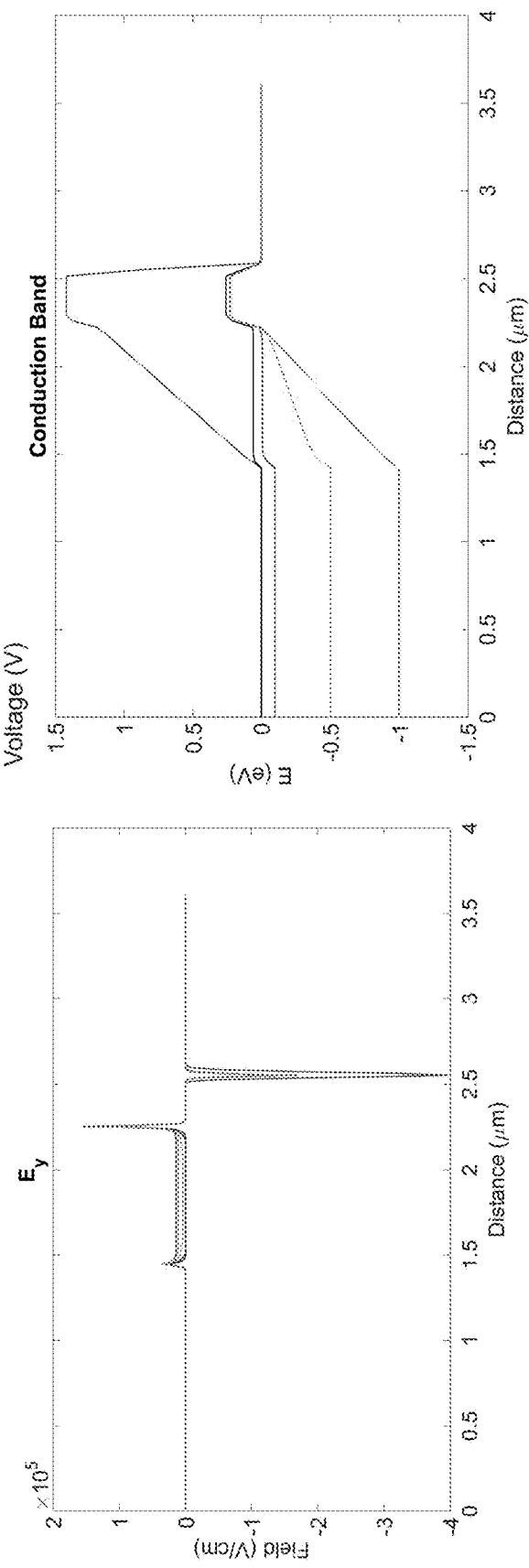
FIG. 57
FIG. 56

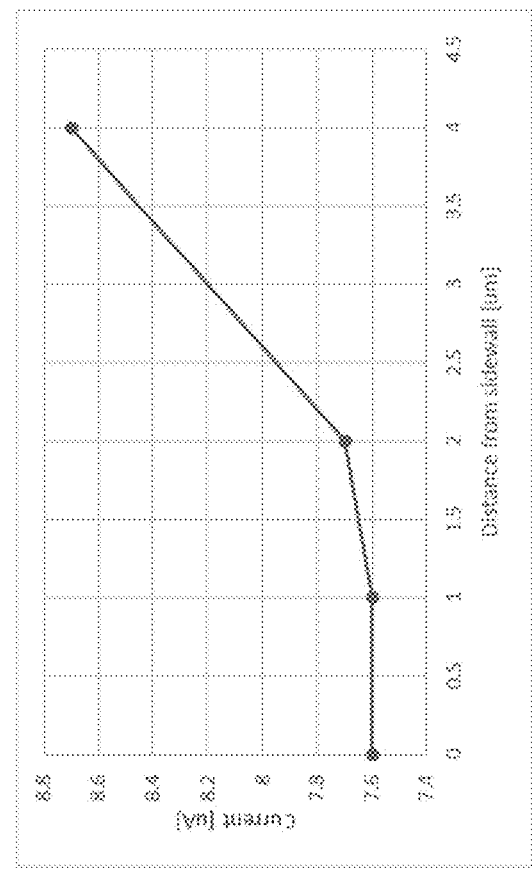
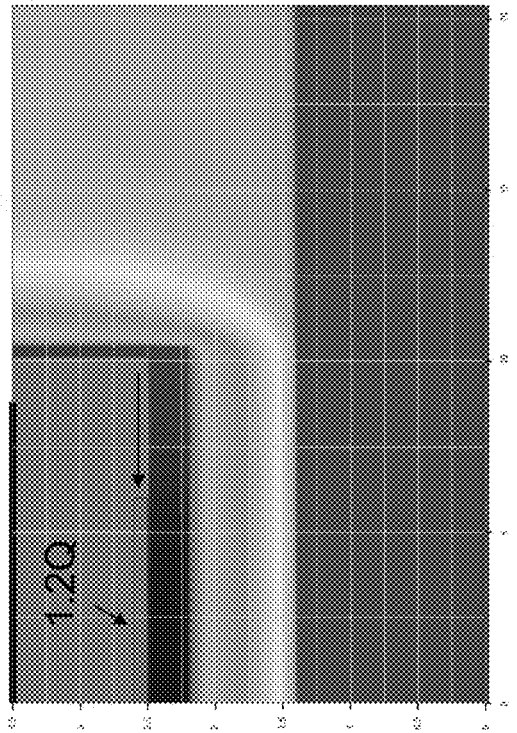
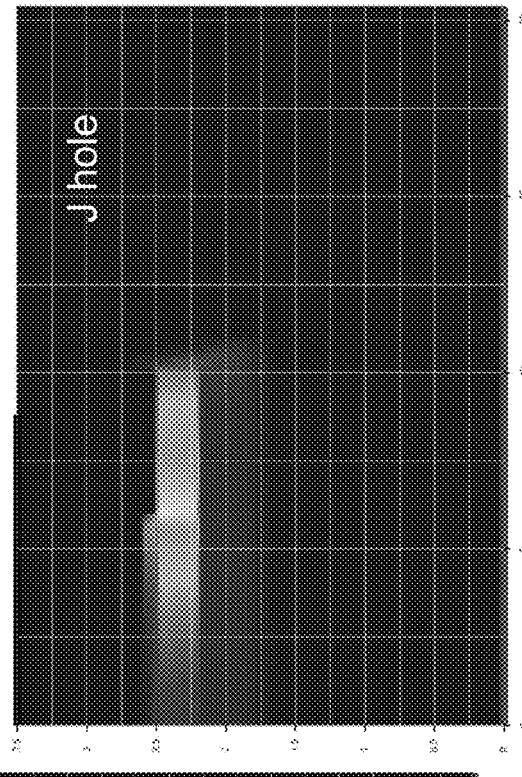
FIG. 65

Current increase with temperature; for variable pullback

Current vs. affinity offset; variable pullback; 320K

SUPPRESSION OF PHOTOTRANSISTOR GAIN IN AN OPTICAL MODULATOR

FIELD OF THE DISCLOSURE

The present disclosure generally relates to semiconductors, namely optical modulators. More particularly, the present disclosure relates to systems and methods for suppression of phototransistor gain in an optical modulator fabricated from III-V semiconductors.

BACKGROUND OF THE DISCLOSURE

NPIN and NIPN modulators are known to have extraordinary benefits for high bandwidth. As known in the art, N stands for an n-type doping region, P stands for a p-type doping region, and I stands for an undoped intrinsic region. See, e.g., Y. Ogiso et al., "80-GHz Bandwidth and 1.5-V Vπ InP-Based IQ Modulator," in Journal of Lightwave Technology, vol. 38, no. 2, pp. 249-255, 15 Jan. 15, 2020; Ogiso, Y., et al. "[011] waveguide stripe direction nipn heterostructure InP optical modulator," Electronics Letters 50.9 (2014): 688-690; and Kikuchi, Nobuhiro, et al. "80-Gb/s low-driving-voltage InP DQPSK modulator with an npin structure," IEEE Photonics Technology Letters 21.12 (2009): 787-789, the contents of which are incorporated by reference in their entirety. However, these disclosures do not mention that NPIN and NIPN structures form a two-terminal heterojunction phototransistor with a photocurrent gain (beta) up to 100. Such a device would amplify DC photocurrent to levels which make it wholly impractical in real systems. Power dependence of performance, modulation pattern dependence (low optical signal-to-noise ratio (OSNR)), poor reliability, and high-power dissipation are a few of the problems that could result. The only mention in the literature is a reference to being "cautious about current leakage" [Y. Ogiso et al., "80-GHz Bandwidth and 1.5-V Vπ InP-Based IQ Modulator," cited above]. It was associated with sidewall damage during dry etching rather than a phototransistor effect.

While NPIN and NIPN modulators have been shown as beneficial for high bandwidth, the phototransistor effect has not been identified. For practical uses of such modulators, these effects must be suppressed.

BRIEF SUMMARY OF THE DISCLOSURE

The present disclosure relates to systems and methods for suppression of phototransistor gain in an optical modulator fabricated from III-V semiconductors, having either an NPIN or NIPN structure. The present disclosure can utilize the NPIN structure such as described in Kikuchi, Nobuhiro, et al. (2009) or in Y. Ogiso et al. (2014). The modulator core is in the intrinsic or undoped region. For an NPIN structure, the present disclosure includes a first upper clad with N-type doping having a first bandgap energy (Emitter), a second upper clad with P-type doping and having a second bandgap energy (Base), and a third upper clad disposed between the first upper clad and the second upper clad with N-type doping and having a third bandgap energy (Sub-Emitter). The third bandgap energy is less than both the first bandgap energy and the second bandgap energy. The present disclosure includes an extra layer, referred to as a sub-emitter layer. The use of a narrow bandgap n-type material between P and N layers is novel. Alternatively, the present disclosure can utilize the NIPN structure in Y. Ogiso et al. (2020). The approach described herein is a key enabler for high bandwidth optical modulators (100 G and beyond).

In an embodiment, an optical modulator includes an emitter layer with N-type doping having a first bandgap energy; a base layer with P-type doping having a second bandgap energy; and a sub-emitter layer disposed between the emitter layer and the base layer, wherein the sub-emitter layer has a third bandgap energy that is less than both the first bandgap energy and the second bandgap energy. The optical modulator can further include a collector layer having n-type doping; and an undoped layer between the collector layer and the base layer. The optical modulator can include an NPIN junction or an NIPN junction. The sub-emitter layer provides a barrier to electrons flowing from the emitter layer, while allowing photo-generated holes to recombine in the sub-emitter layer thereby mitigating current amplification. The optical modulator can further include a first contact disposed to the emitter layer; and a second contact disposed to the collector layer. The third bandgap energy can be about 1.1 to 1.2 Q where Q is bandgap measured in μm. The third bandgap energy can be about 1.2 Q where Q is bandgap measured in μm. The optical modulator is fabricated from III-V semiconductors. The sub-emitter layer can include a quaternary alloy that is either P-based (InGaAsP) or Al-based (InGaAlAs) which is lattice-matched to InP.

In another embodiment, a method of forming an optical modulator includes forming an emitter layer with N-type doping having a first bandgap energy; forming a base layer with P-type doping having a second bandgap energy; and forming a sub-emitter layer disposed between the emitter layer and the base layer, wherein the sub-emitter layer has a third bandgap energy that is less than both the first bandgap energy and the second bandgap energy. The method can further include forming a collector layer having n-type doping; and forming an undoped layer between the collector layer and the base layer. The optical modulator can include an NPIN junction or an NIPN junction. The sub-emitter layer provides a barrier to electrons flowing from the emitter layer, while allowing photo-generated holes to recombine in the sub-emitter layer thereby mitigating current amplification. The method can further include forming a first contact disposed to the emitter layer; and forming a second contact disposed to the collector layer. The third bandgap energy can be about 1.1 to 1.2 Q where Q is bandgap measured in μm. The third bandgap energy can be about 1.2 Q where Q is bandgap measured in μm. The optical modulator is fabricated from III-V semiconductors. The sub-emitter layer can include a quaternary alloy that is either P-based (InGaAsP) or Al-based (InGaAlAs) which is lattice-matched to InP.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 20-23 are graphs of the PIN photo response when short-circuited/reverse biased. FIG. 20 is a graph of conduction band, FIG. 21 is a graph of electric field, FIG. 22 is a graph of current-light characteristics, and FIG. 23 is a graph of DC IV characteristic.

FIG. 24 is a graph of conduction band, FIG. 25 is a graph of electric field, FIG. 26 is a graph of electron concentration, and FIG. 27 is a graph of hole concentration.

FIGS. 30-32 are graphs of a baseline photo response for the NPIN modulator 30 in. FIG. 30 is a graph of DC IV characteristic, FIG. 31 is a graph of the electric field, and FIG. 32 is a graph of the conduction band.

FIG. 33 is a graph of DC IV characteristic, FIG. 34 is a graph of the electric field, and FIG. 35 is a graph of the conduction band.

FIGS. 36-38 are graphs of the effects of widening the base. FIG. 36 is a graph of DC IV characteristic, FIG. 37 is a graph of the electric field, and FIG. 38 is a graph of the conduction band.

FIGS. 42-44 are graphs of the InGaAs—NPIN Photo response (Narrow BG Emitter). FIG. 42 is a graph of DC IV characteristic, FIG. 43 is a graph of the electric field, and FIG. 44 is a graph of the conduction band.

FIGS. 45-47 are graphs of the InAlAs—NPIN Photo response (Wide BG Emitter). FIG. 45 is a graph of DC IV characteristic, FIG. 46 is a graph of the electric field, and FIG. 47 is a graph of the conduction band.

FIG. 48 is graphs of the heterostructure NPIN photo response as a function of sub-emitter bandgap energy.

FIGS. 49-51 are graphs of gain vs. blocking layer thickness and composition. FIG. 49 is a bandgap graph, FIG. 50 is a graph of $\beta$ vs. blocker position, and FIG. 51 is a graph of $\beta$ vs. blocking layer thickness.

FIGS. 55-57 are graphs of the InAlAs—NPIN Photo response (Wide BG Base). FIG. 55 is a graph of DC IV characteristic, FIG. 56 is a graph of the electric field, and FIG. 57 is a graph of the conduction band.

FIG. 65 is graphs of NPIN current as 1.2Q sidewall is pulled back.

DETAILED DESCRIPTION OF THE DISCLOSURE

Again, the present disclosure relates to systems and methods for suppression of phototransistor gain in an optical modulator fabricated from III-V semiconductors, having either an NPIN or NIPN structure. The present disclosure can utilize the NPIN structure such as described in Kikuchi, Nobuhiro, et al. (2009) or in Y. Ogiso et al. (2014). The modulator core is in the intrinsic or undoped region. For an NPIN structure, the present disclosure includes a first upper clad with N-type doping having a first bandgap energy (Emitter), a second upper clad with P-type doping and having a second bandgap energy (Base), and a third upper clad disposed between the first upper clad and the second upper clad with N-type doping and having a third bandgap energy (Sub-Emitter). The third bandgap energy is less than both the first bandgap energy and the second bandgap energy. The present disclosure includes an extra layer, referred to as a sub-emitter layer. The use of a narrow bandgap n-type material between P and N layers is novel. Alternatively, the present disclosure can utilize the NIPN structure in Y. Ogiso et al. (2020). The approach described herein is a key enabler for high bandwidth optical modulators (100 G and beyond).

Conventional PIN/NPIN Modulator

Figure 1:
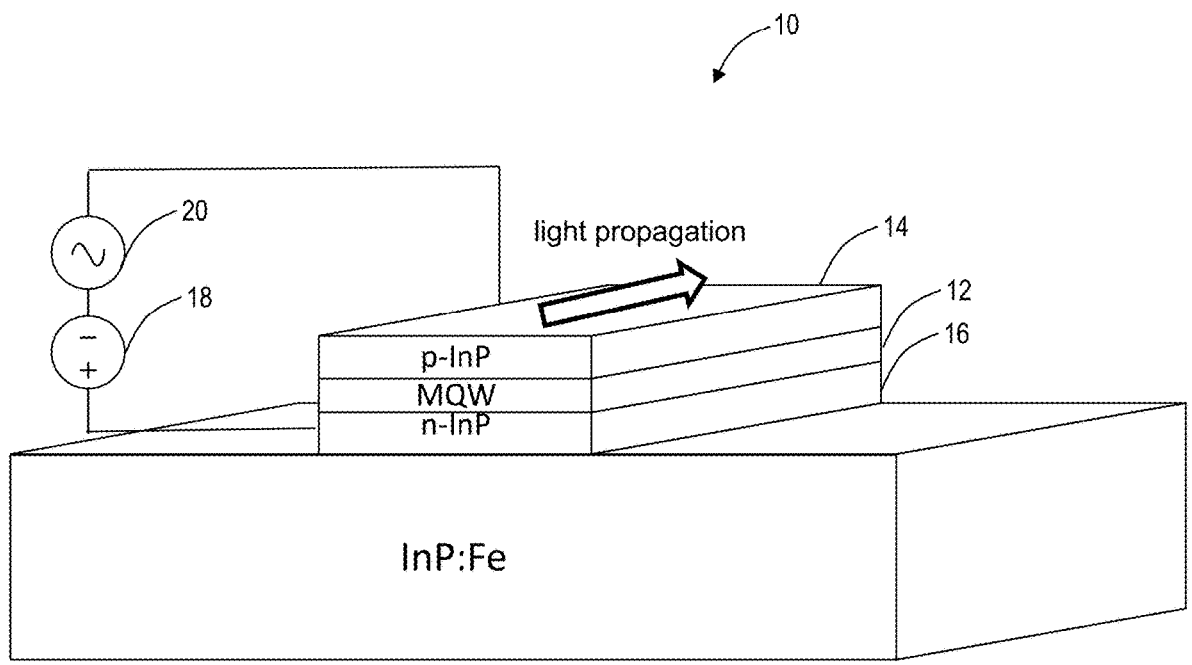
FIG. 1 is a diagram of a conventional indium phosphide (InP) P-I-N modulator.

FIG. 1 is a diagram of a conventional indium phosphide (InP) PIN modulator 10. The InP PIN modulator 10 includes a multi-quantum well (MQW) region 12 with doped upper/bottom (P—InP, N—InP) claddings, layers 14, 16. This is an optical ridge waveguide in which light is phase modulated.

A DC electric voltage 18 is applied across the p- and n-layers 14, 16 keep the PIN stack-up in reverse bias. An AC voltage 20 dynamically modulates the phase of the optical signal.

Figure 2:
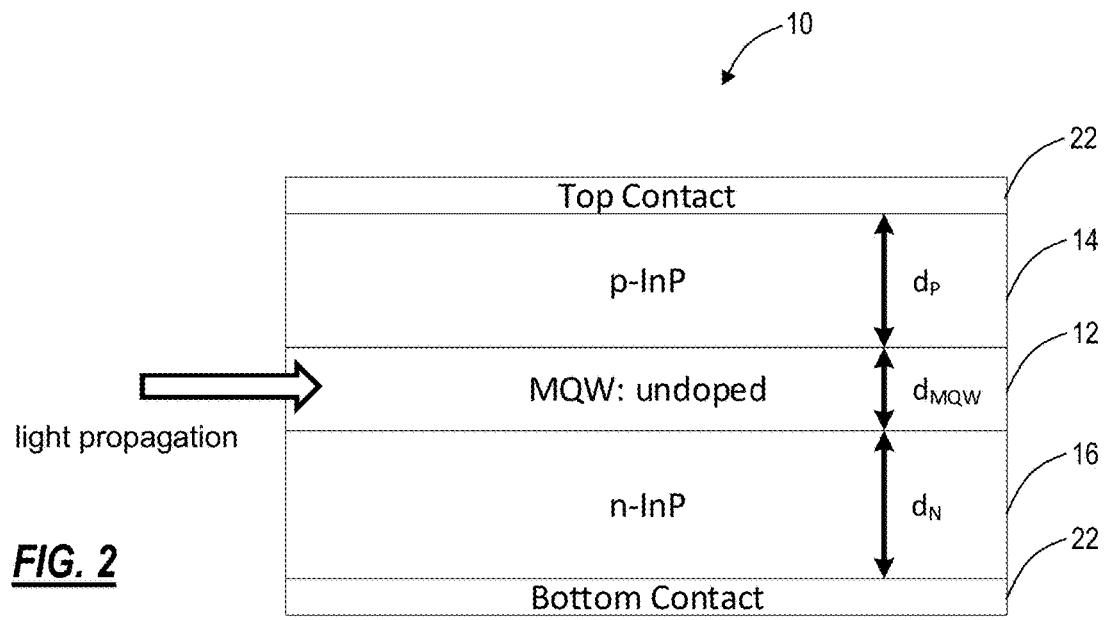
FIG. 2 is a cross-sectional diagram of the PIN modulator.

FIG. 2 is a cross-sectional diagram of the PIN modulator 10. The PIN modulator 10 includes top and bottom contacts 22, that connect to the voltages 18, 20. There are the layers 14, 16 and the MQW region 12. Light propagates in the MQW region 12 from left to right. Bandwidth is limited by p-cladding contact/series resistance.

Figure 3:
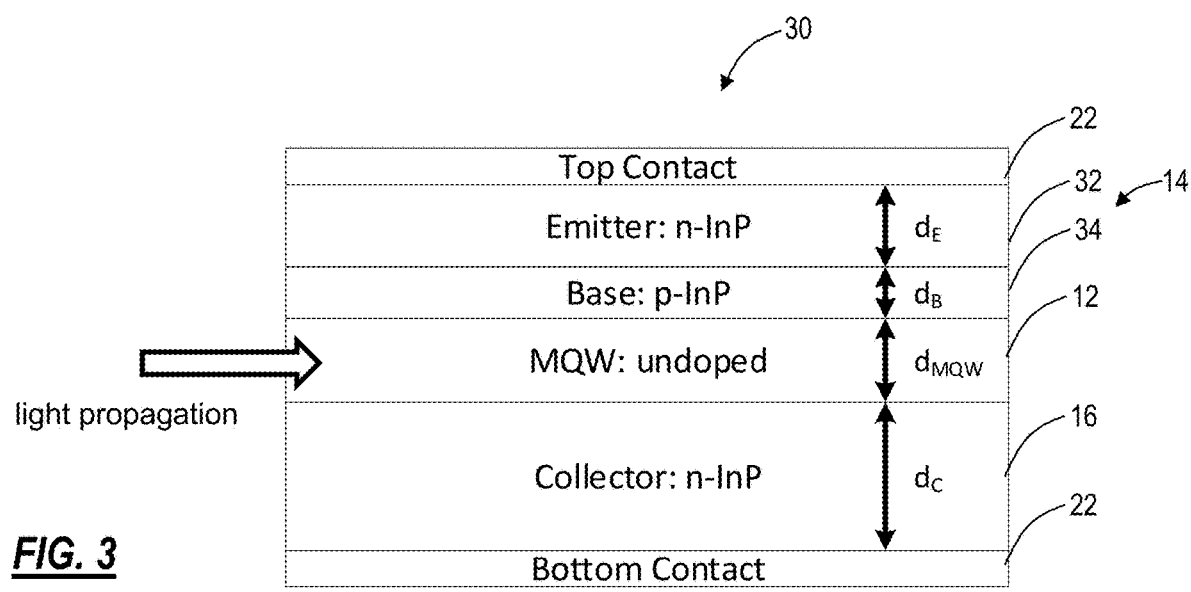
FIG. 3 is a cross-sectional diagram of a NPIN modulator that provides improvements over the PIN modulator.

FIG. 3 is a cross-sectional diagram of a NPIN modulator 30 that provides improvements over the PIN modulator 10. The NPIN modulator 30 includes the contacts 22, the layer 16, and the MQW region 12, and further includes the layer 14 having an emitter n-InP layer 32 and a base p-InP layer 34. Here, the p-doping in the layer 16 is replaced with more conductive n-doped material. The n-doped structures in the emitter n-InP layer 32 have reduced contact resistivity. The p-doped layer 34 is a current blocking layer. Such structures have the highest reported bandwidth in the literature.

Substitution of the PIN stack-up of the PIN modulator 10 with the NPIN in the NPIN modulator 30 improves device performance. The NPIN stack-up, however, resembles a typical NPN bipolar junction transistor (BJT), which could amplify the photo-generated current in the MQW region 12. This photo-transistor effect is detrimental to the device operation and needs to be suppressed/eliminated.

Figure 4:
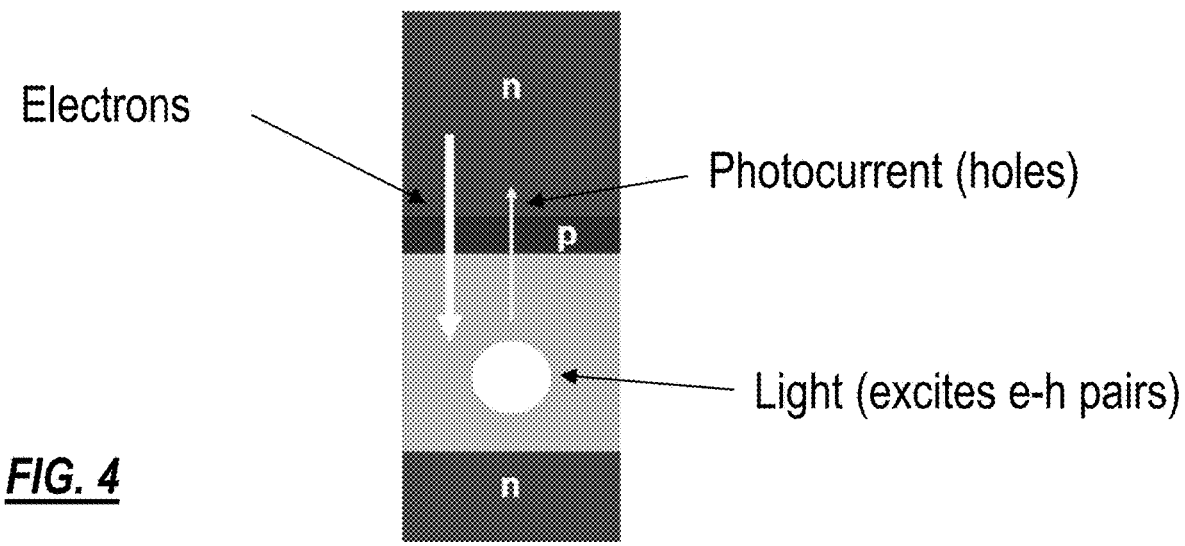
FIG. 4 is a diagram of the NPIN modulator for describing the photo-transistor effect problem.

FIG. 4 is a diagram of the NPIN modulator 30 for describing the photo-transistor effect problem. With lights "on," the NPIN structure acts as a photocurrent amplifier; such devices have been commercialized as light detectors in other industries where amplification is desirable. For modulator design, large photocurrent will cause excessive power dissipation and loss of modulator efficiency; this phenomenon needs to be suppressed. Of note, there has not been a discussion in academic journals for high performance modulators of how to address this problem.

NPIN Modulator with a Heterostructure for Reducing the Photo-Transistor Effect

Figure 5:
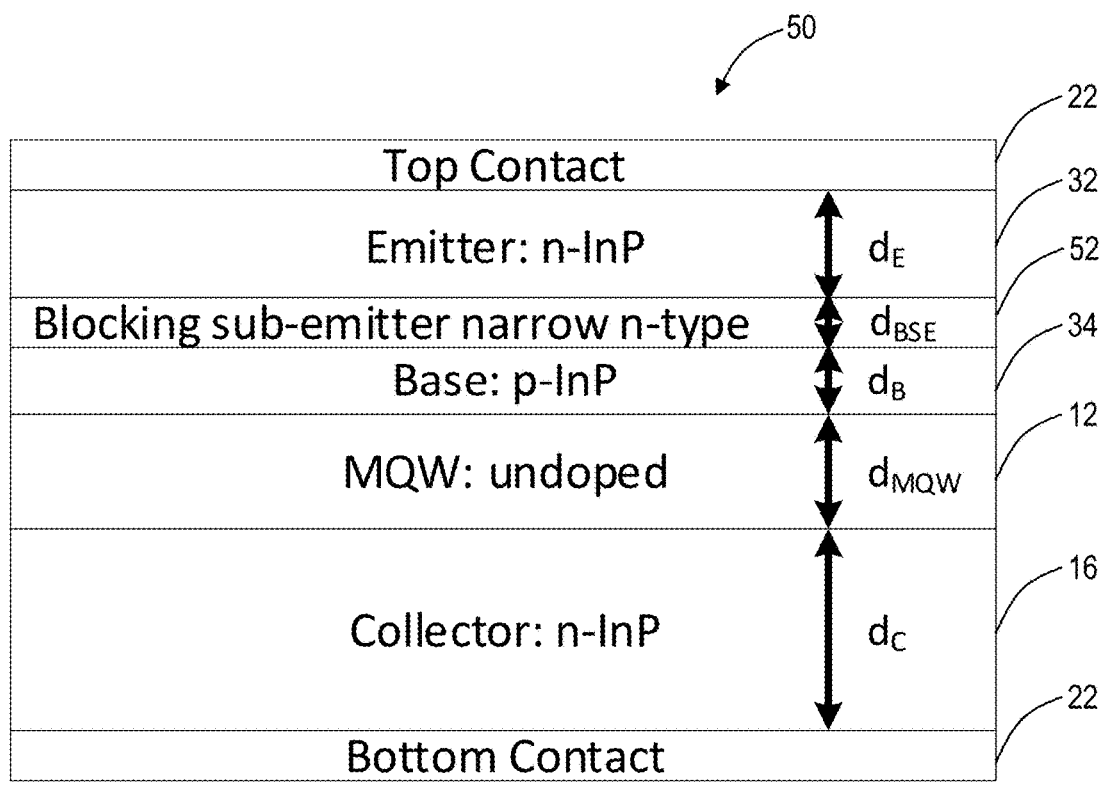
FIG. 5 is a diagram of an NPIN modulator according to the present disclosure with a heterostructure for reducing the photo-transistor effect problem with the NPIN modulator of FIGS. 3 and 4.

FIG. 5 is a diagram of an NPIN modulator 50 according to the present disclosure with a heterostructure for reducing the photo-transistor effect problem with the NPIN modulator 30. FIG. 5 is a cross-sectional view of an epitaxy layer structure of the NPIN modulator 50. The NPIN modulator 50 includes the contacts 22, a collector n-InP layer 16, the MQW region 12 (intrinsic region), a base p-InP layer 34, a new blocking sub-emitter narrow n-type layer 52, and an emitter n-InP layer 32.

Of note, the description herein focuses on the NPIN modulator 50. Those skilled in the art will recognize the blocking sub-emitter narrow n-type layer 52 can also be used with an NIPN modulator.

The emitter n-InP layer 32 has a first bandgap energy. The base p-InP layer 34 has a second bandgap energy. The sub-emitter narrow n-type layer 52 has a third bandgap energy that is less than both the first bandgap energy and the second bandgap energy.

Figure 6:
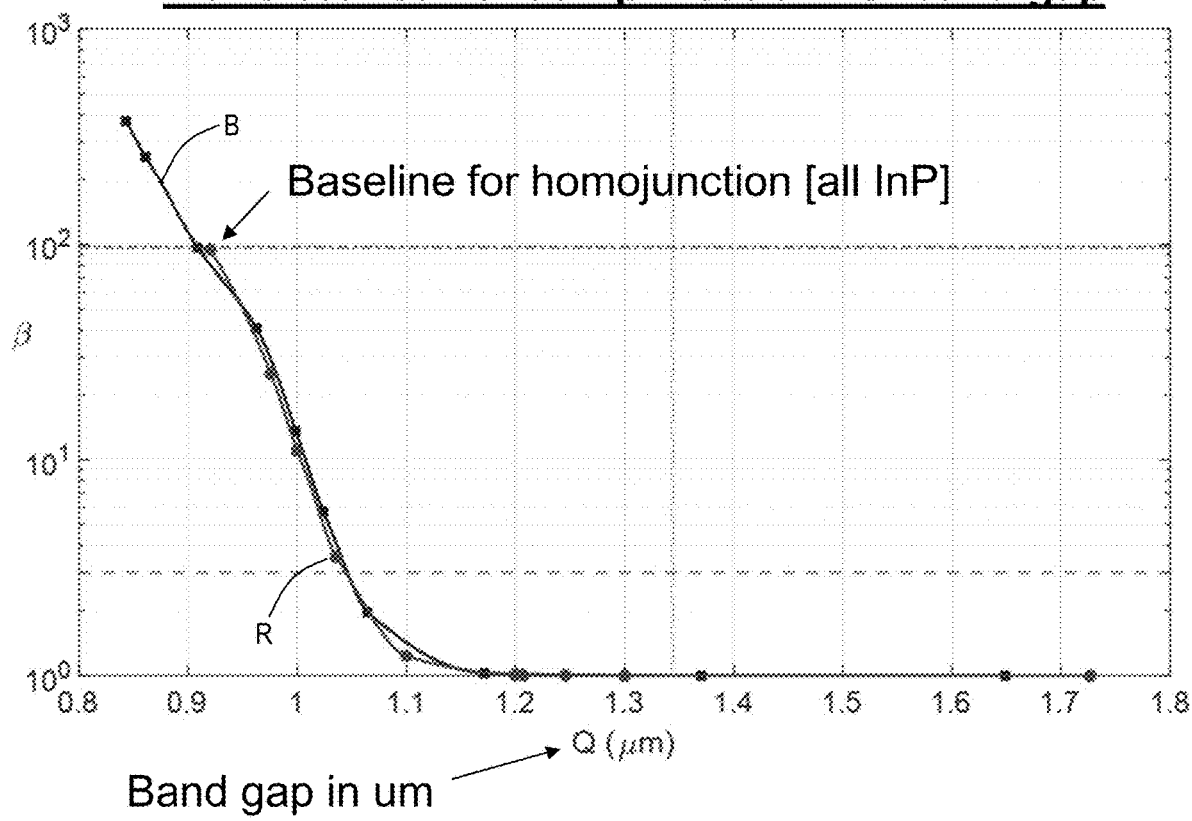
FIG. 6 is a graph of transistor current amplification versus band-gap.

The blocking sub-emitter narrow n-type layer 52 is a narrow-band structure to suppress amplification. It is not possible to make band-gap too narrow due to optical loss and the sweet spot for the blocking sub-emitter narrow n-type layer 52 is around 1.1-1.2Q, for C-band operation; note, Q is the bandgap measured in µm. FIG. 6 is a graph of transistor current amplification versus band-gap. Curves B, R respectively are associated with InGaAsP and InGaAlAs sub-emitter systems. It further demonstrates that only the bandgap of the sub-emitter is of essence not the particular alloy (P-based vs. Al-based).

Figure 7:
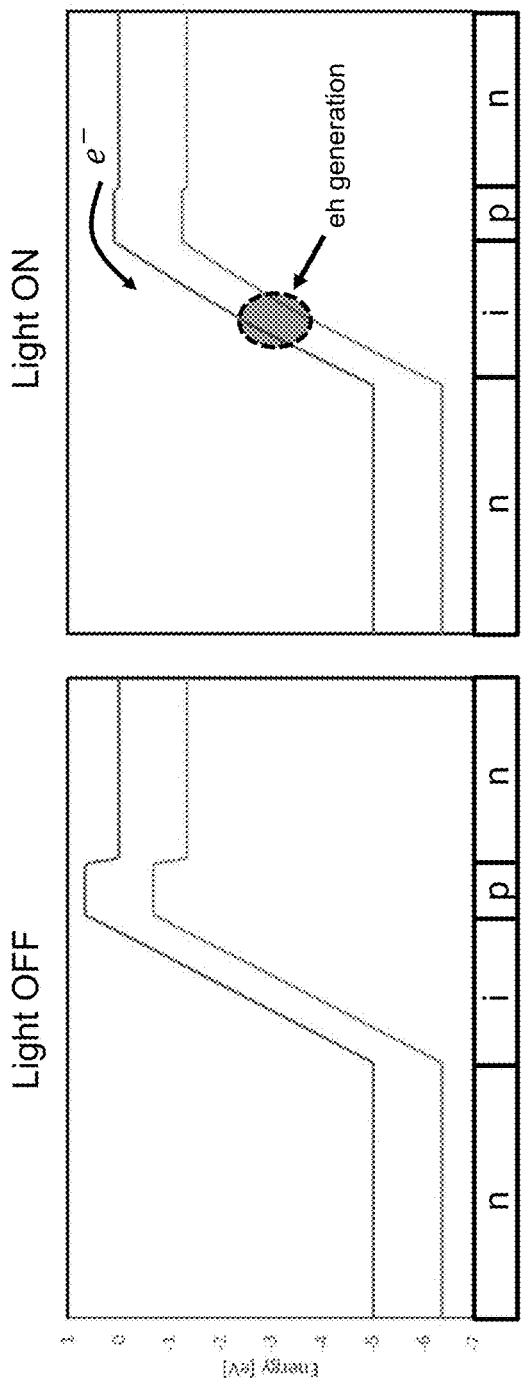
FIG. 7 is an InP NPIN band diagram of reverse bias with and without light for the NPIN modulator of FIGS. 3 and 4.
Figure 8:
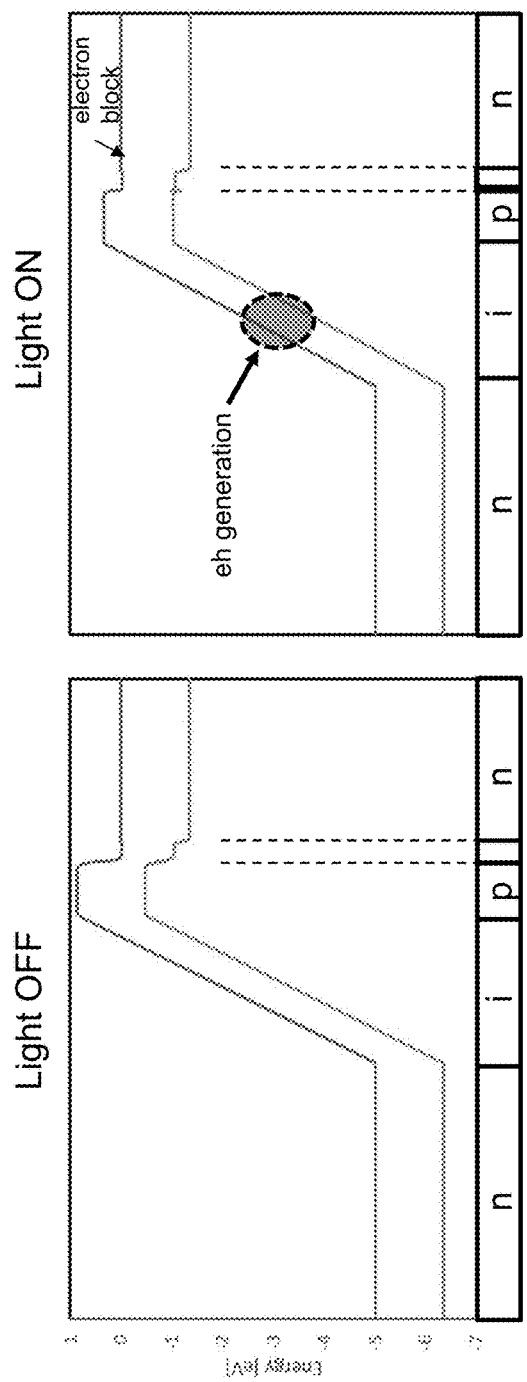
FIG. 8 is an InP NPIN band diagram of reverse bias with and without light for the NPIN modulator of FIG. 5 with the blocking sub-emitter.

FIG. 7 is an InP NPIN band diagram of reverse bias with and without light for the NPIN modulator 30. FIG. 8 is an InP NPIN band diagram of reverse bias with and without light for the NPIN modulator 50 with the blocking sub-emitter.

Figure 9:
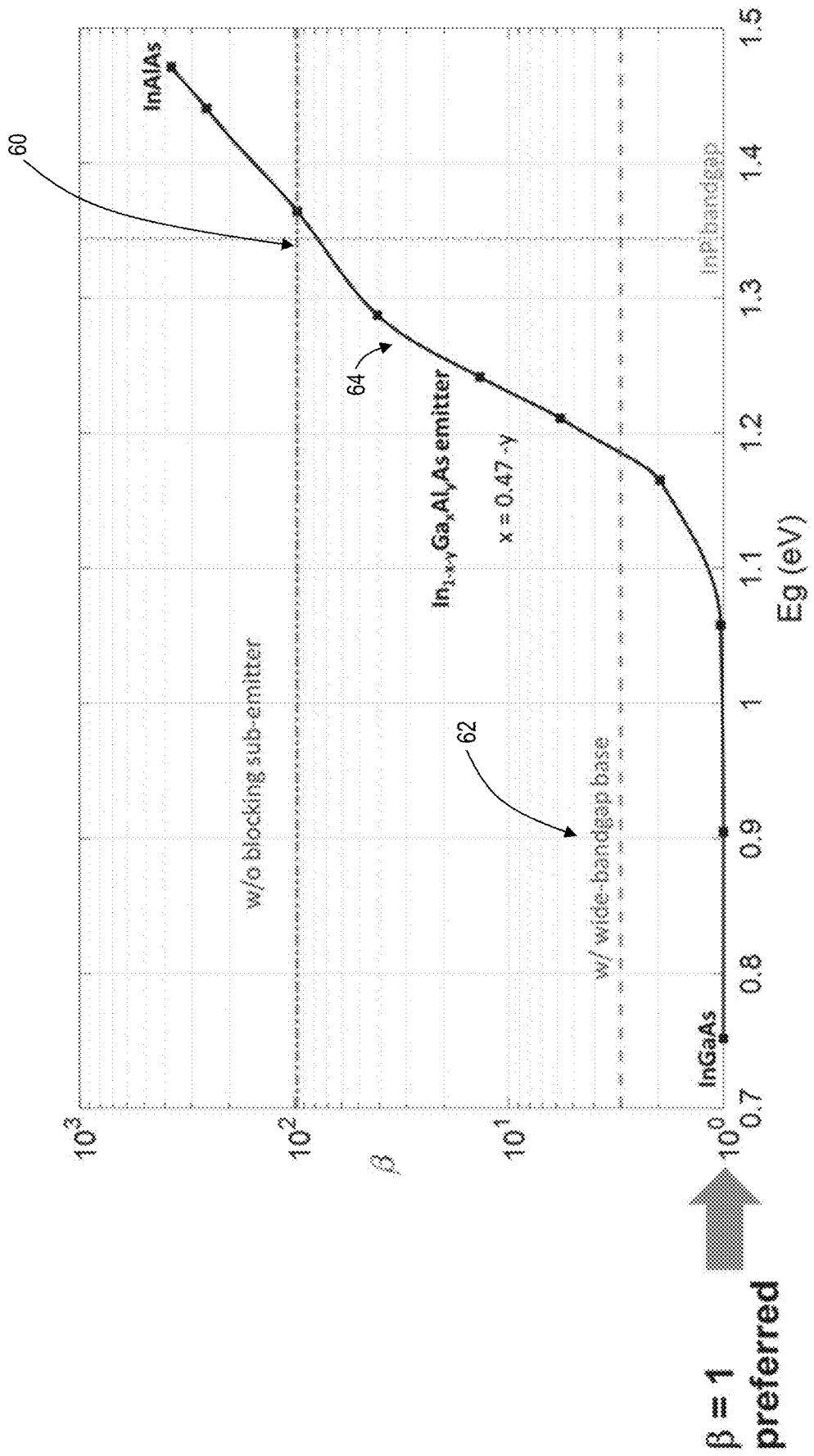
FIG. 9 is a graph of photo-transistor current gain versus sub-emitter bandgap in the NPIN modulator.

FIG. 9 is a graph of photo-transistor current gain versus sub-emitter bandgap in the NPIN modulator 50. At an intersection 60, marked "w/o blocking sub-emitter" and "InP bandgap", respectively, is the gain (100) of the modulator 30 if no measures are taken to suppress phototransistor action. A line 62 labelled "w/wide bandgap base" is the effect of the Prior Art of incorporating an InAlAs "blocking layer" into the base. The current gain is 3. A line 64 below at any energy gap<1.05 eV is the beneficial effect of this disclosure. The gain is reduced to the theoretical low limit of 1. Physically, the sub-emitter provides a barrier to electrons flowing from the emitter, while allowing photo-generated holes to recombine in the sub-emitter layer thereby mitigating current amplification. See FIG. 8.

NPIN Design as a BJT Transistor

This section includes a set of electrical simulations showing that NPIN structures are capable of transistor action (current amplification). Simulations were initial exercises to understand the extent of the problem and serves as a brief review of transistor action in a vertical NPN BJT.

Figure 10:
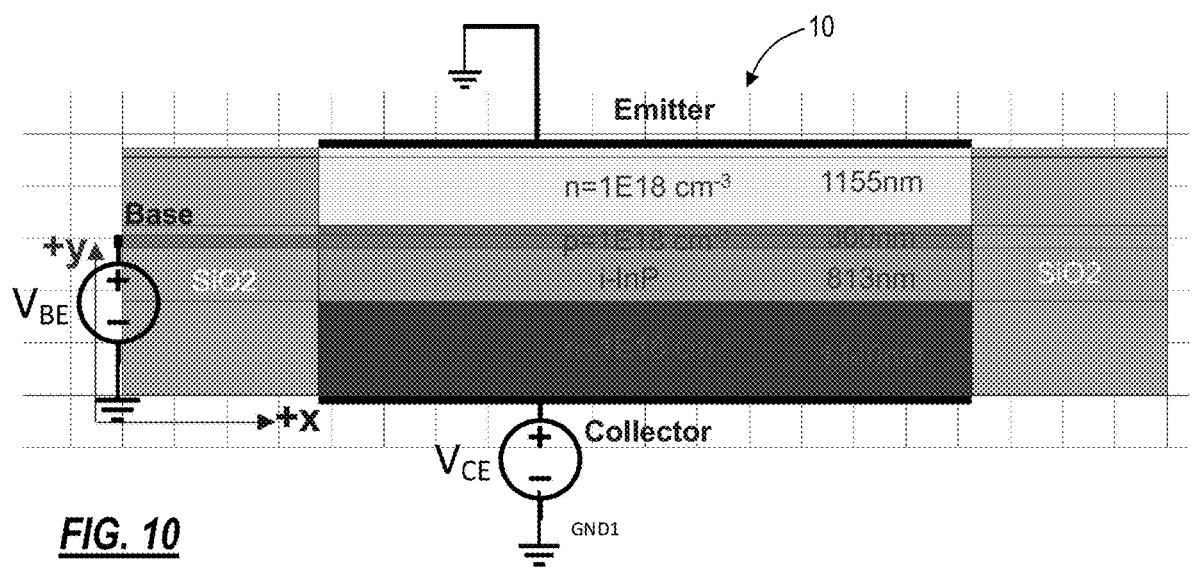
FIG. 10 is a circuit diagram of the NPIN modulator.
Figure 11:
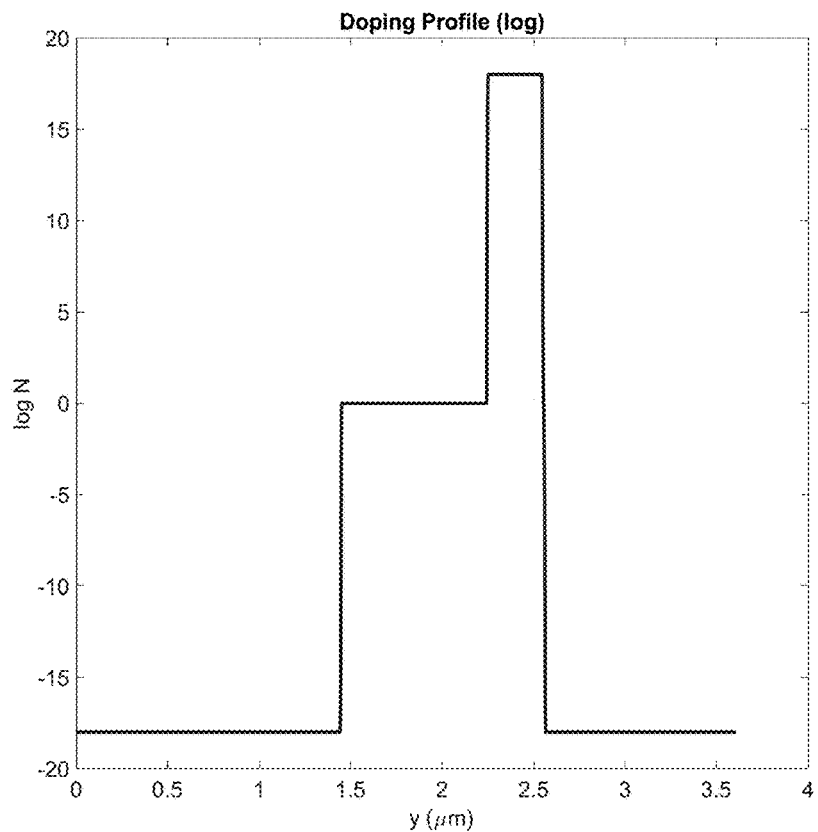
FIG. 11 is a graph of doping profile of the NPIN modulator of FIG. 5.
Figure 12:
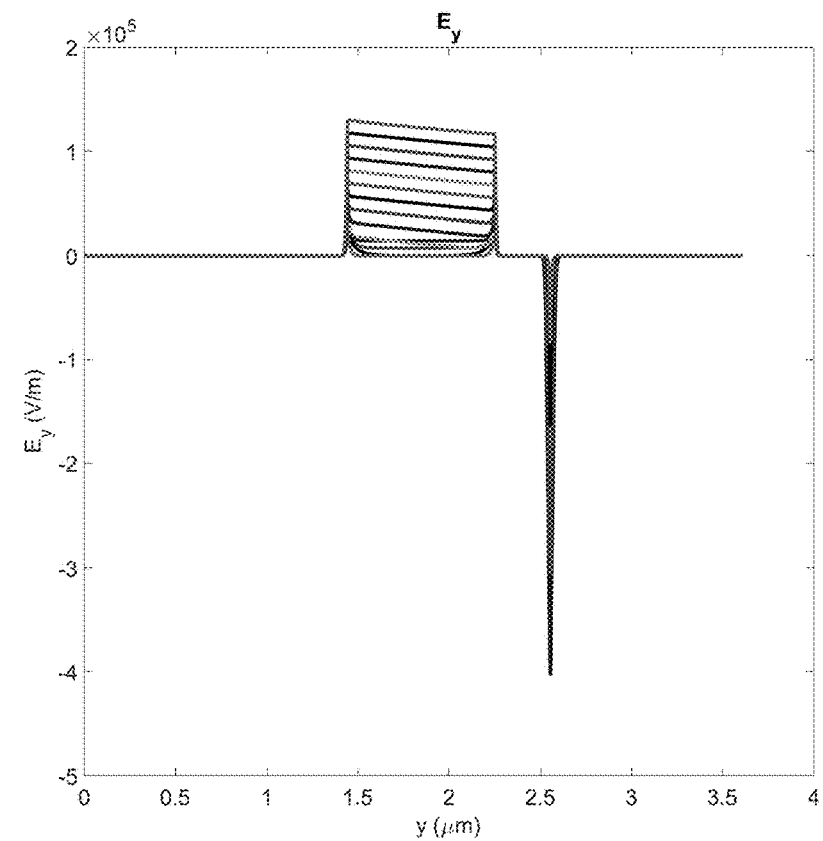
FIG. 12 is a graph of the electric field in the NPIN modulator of FIG. 5.
Figure 13:
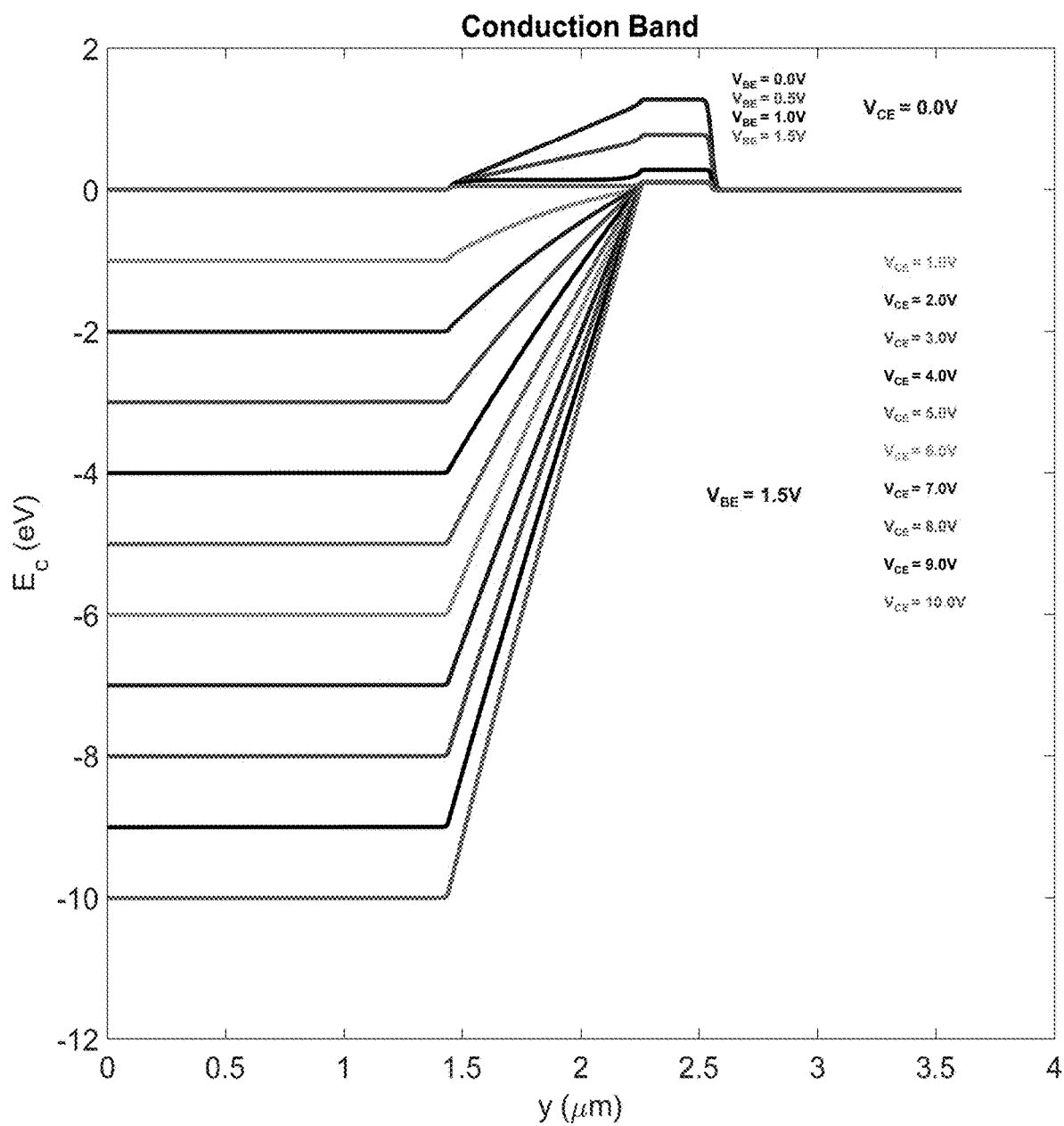
FIG. 13 is a graph of the electric field in the conduction band of the NPIN modulator of FIG. 5.

FIG. 10 is a circuit diagram of the NPIN modulator 50. The NPIN modulator 50 is a BJT. FIG. 11 is a graph of doping profile of the NPIN modulator 50. FIG. 12 is a graph of the electric field in the NPIN modulator 50. FIG. 13 is a graph of the conduction band energy as a function of applied external bias of the NPIN modulator 50.

Figure 14:
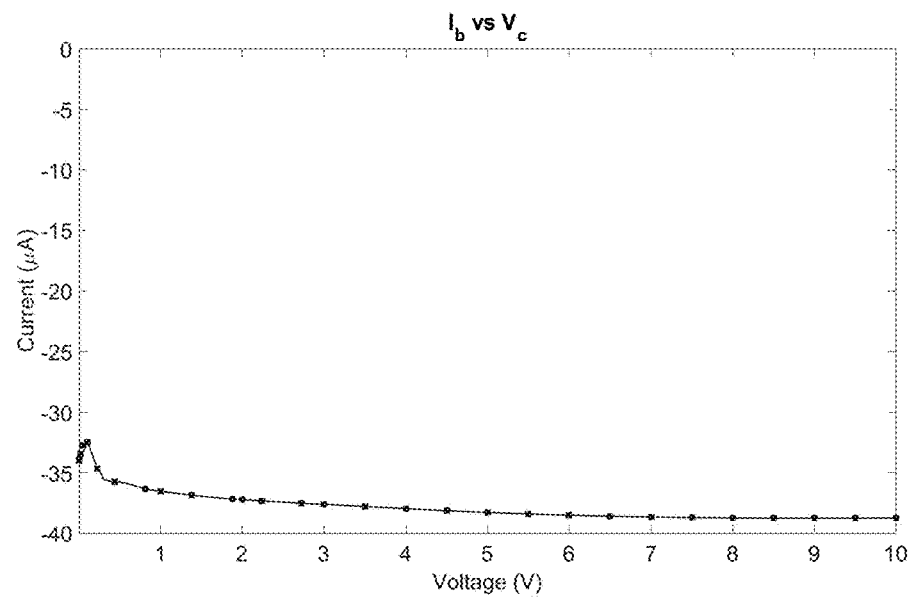
FIGS. 14-16 are graphs of current versus voltage when the BJT is turned on. Of note, the current (I) and voltage (V) are shown for the base (b), emitter (e), and collector (c).
Figure 15:
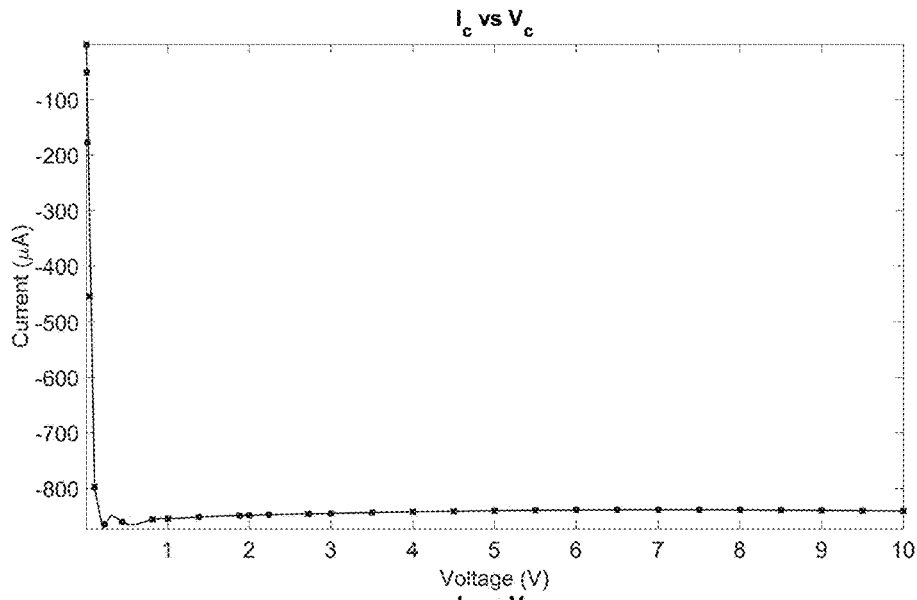
Figure 16:
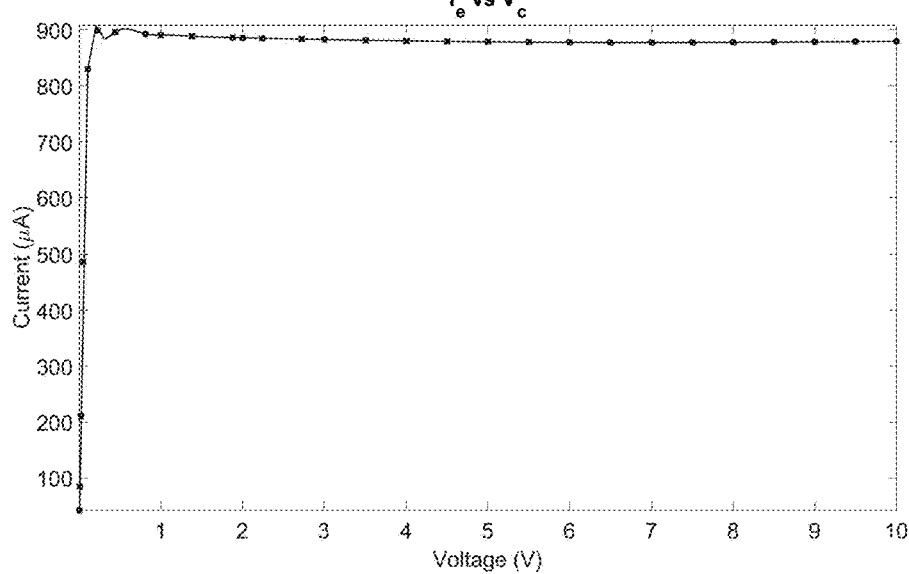

FIGS. 14-16 are graphs of current versus voltage when the BJT is turned on. Of note, the current (I) and voltage (V) are shown for the base (b), emitter (e), and collector (c).

Figure 17:
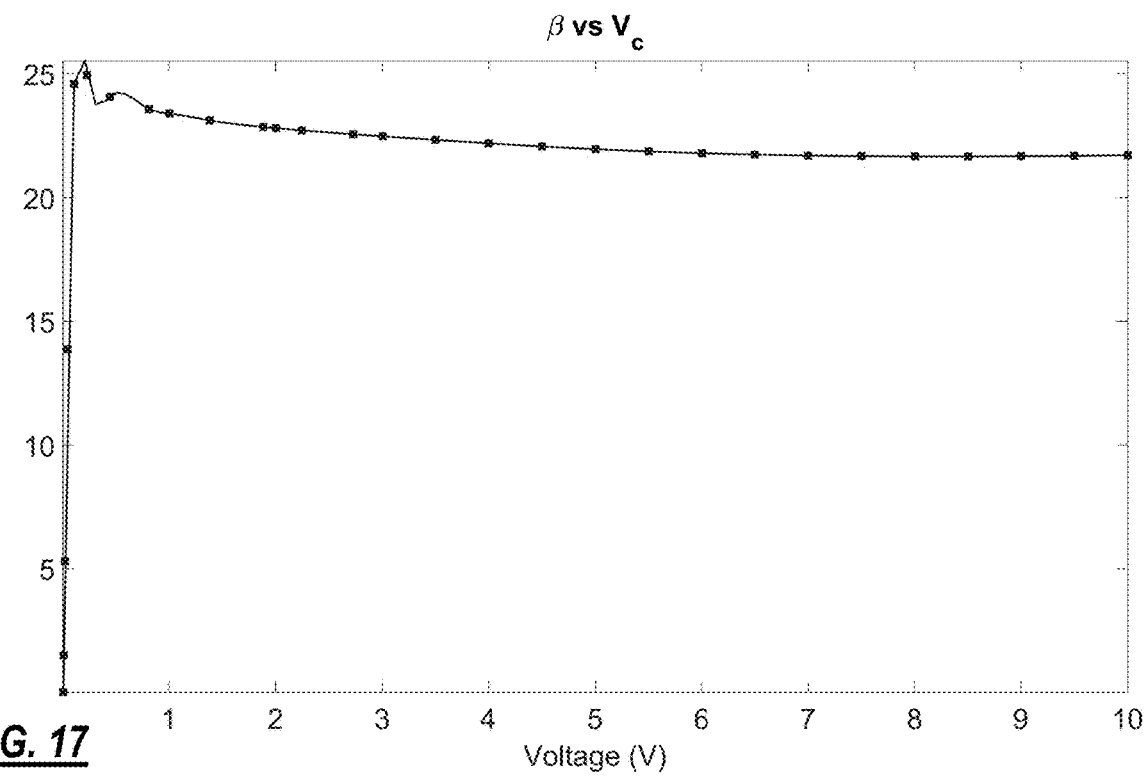
FIG. 17 is a graph of DC Current Gain ($\beta$) for the BJT.
Figure 18:
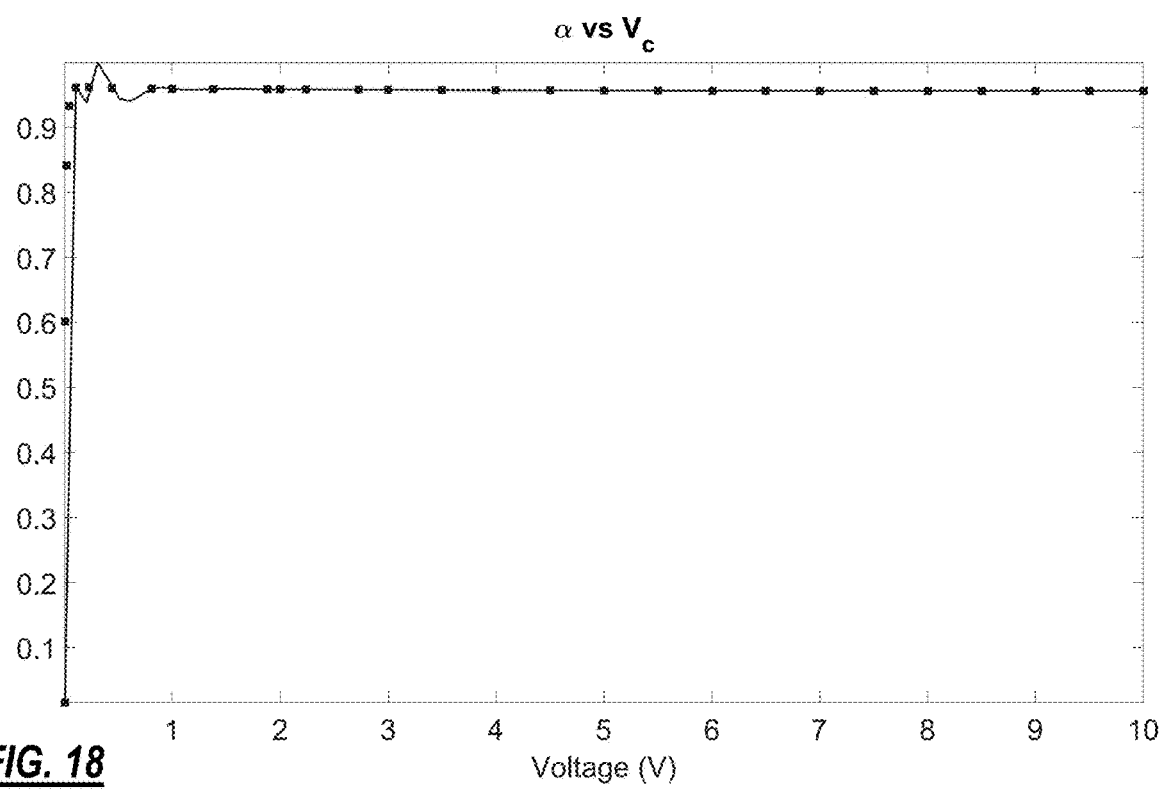
FIG. 18 is a graph of Current Transfer Ratio ($\alpha$) for the BJT.

FIG. 17 is a graph of DC Current Gain (β) for the BJT. FIG. 18 is a graph of Current Transfer Ratio (α) for the BJT.

| Emitter injection efficiency | $\gamma \equiv \dfrac{I_{En}}{I_{En} + I_{Ep}}$ |
|---|---|
| Base transport factor | $B \equiv \dfrac{I_C}{I_{En}}$ |
| Current transfer ratio | $\alpha \equiv \dfrac{I_C}{I_E} = B\gamma$ |
| Current gain | $\beta \equiv \dfrac{I_C}{I_B} = \dfrac{B\gamma}{1-B\gamma} = \dfrac{\alpha}{1-\alpha}$ |

PIN Diode Photo Response

This section simulates the baseline performance of a conventional PIN diode structure with optical stimulus, i.e., the PIN modulator 10. This establishes the baseline photocurrent levels for these models and sets expectations for what needs to be achieved from any new NPIN designs.

Figure 19:
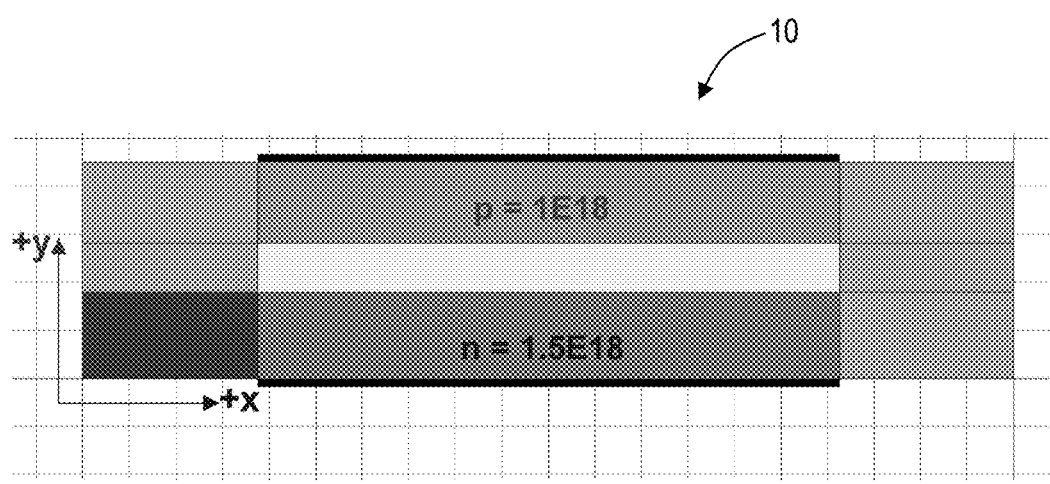
FIG. 19 is a diagram of a physical layout of the PIN modulator 10 in the y and x dimensions, for reference and use with FIGS. 20-28.

FIG. 19 is a diagram of a physical layout of the PIN modulator 10 in the y and x dimensions, for reference and use with FIGS. 20-28.

FIGS. 20-23 are graphs of the PIN photo response when short-circuited/reverse biased. FIG. 20 is a graph of conduction band, FIG. 21 is a graph of electric field, FIG. 22 is a graph of current-light characteristics, and FIG. 23 is a graph of DC IV characteristic. Photocurrent varies linearly with input optical power. A photocurrent of ~6.7 µA flows with no applied bias, i.e., short-circuit current. Photocurrent is independent of applied voltage.

Figure 24:
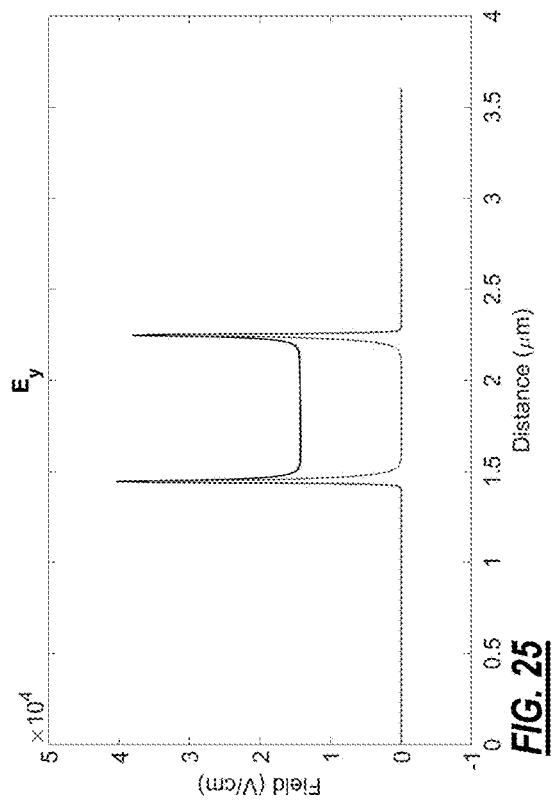
FIGS. 24-27 are graphs of the PIN photo response with open-circuit voltage.
Figure 25:
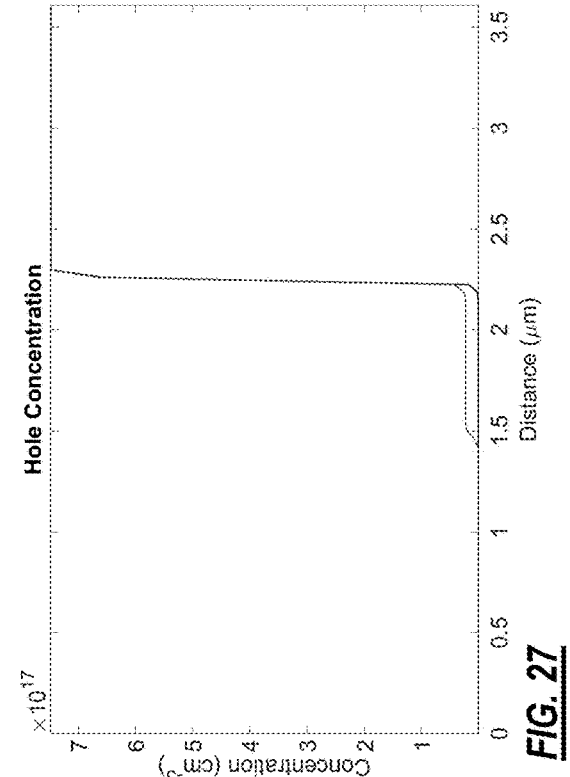
Figure 26:
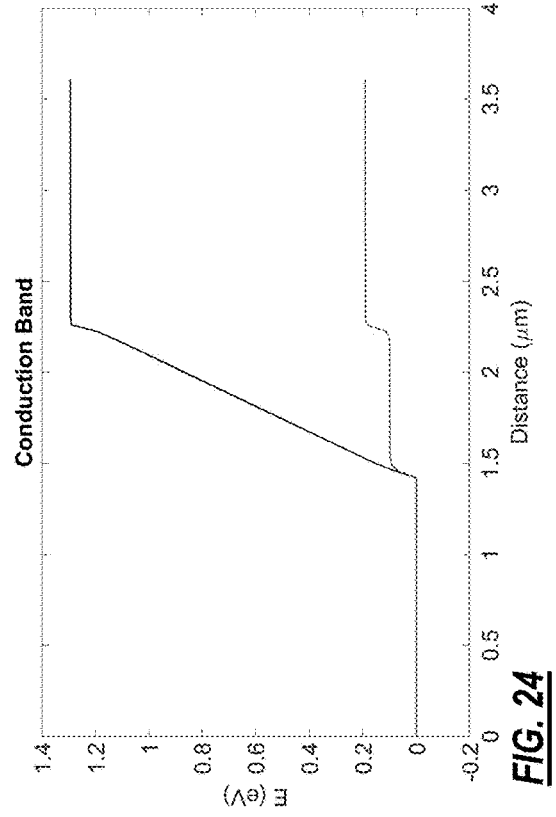
Figure 27:
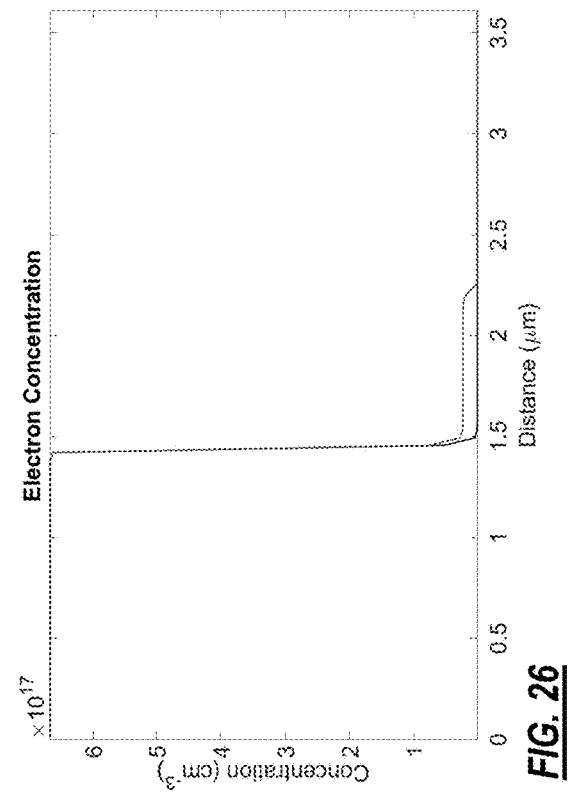

FIGS. 24-27 are graphs of the PIN photo response with open-circuit voltage. FIG. 24 is a graph of conduction band, FIG. 25 is a graph of electric field, FIG. 26 is a graph of electron concentration, and FIG. 27 is a graph of hole concentration. Accumulation of excess electrons (holes) on the left (right) hand side of the intrinsic layer creates a dipole whose electric field opposes and cancels the built-in field of the p-i-n structure. Therefore, in the middle of the intrinsic region the drift (E=0) or diffusion (n,p are uniform) components of the current vanish for both type of carriers. The open-circuit voltage of the structure is equal to 1.102V.

Figure 28:
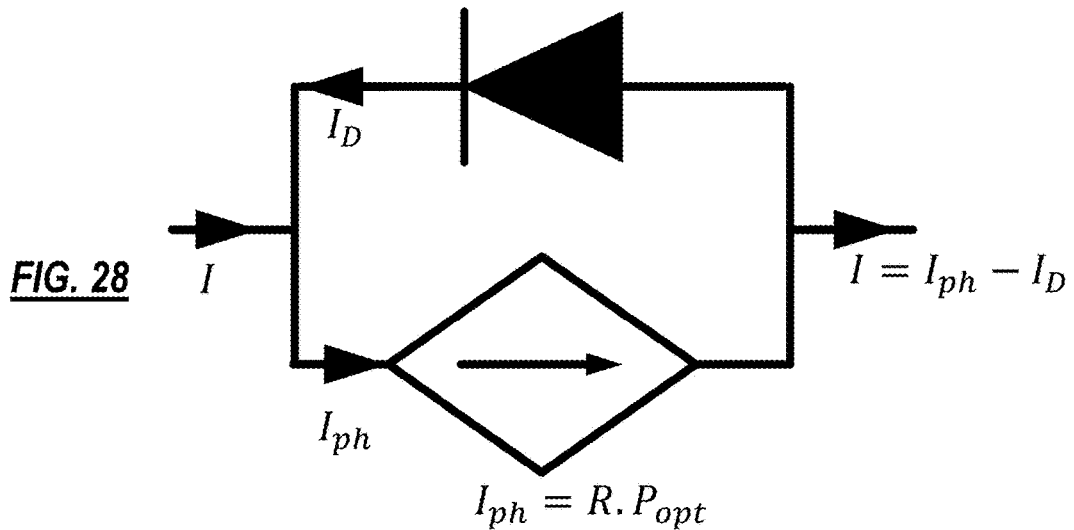
FIG. 28 is a circuit diagram of the open-circuit voltage for the PIN photo response.

FIG. 28 is a circuit diagram of the open-circuit voltage for the PIN photo response. The open-circuit voltage is, in essence, equivalent to an optically induced bias.

| Short-circuited PIN under illumination | $I_D = 0$ |
| | $I = I_{ph} = R.P_{opt}$ |
| Open-Circuited PIN under illumination | $I = 0 \Rightarrow I_D = I_{ph}$ |
| | $V_D = \dfrac{kT}{q} \ln\left(1 + \dfrac{R.P_{opt}}{I_0}\right)$ |

NPIN Photo Response

This section explores the performance of the NPIN modulator 30 that does not use the proposed heterostructure. Note that the nominal photocurrent levels are nearly 100× larger than what was achieved for a conventional PIN structure. A subsequent series of simulations demonstrates that the current amplification factor cannot be easily suppressed by changes to the geometry of the structure. Although not described herein, the design changes considered are impractical as they would impose significant penalties to the device bandwidth.

Figure 29:
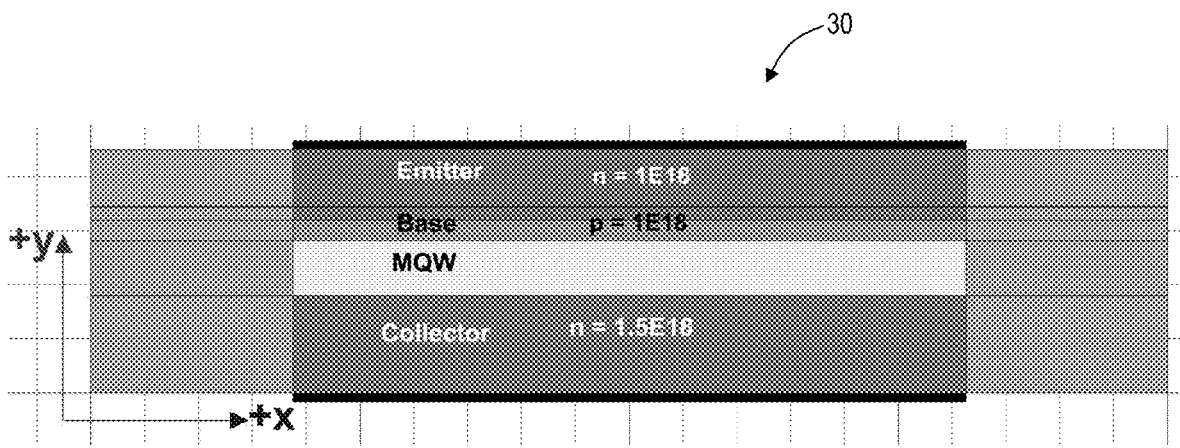
FIG. 29 is a diagram of a physical layout of the NPIN modulator 30 in the y and x dimensions, for reference and use with FIGS. 30-39.

FIG. 29 is a diagram of a physical layout of the NPIN modulator 30 in the y and x dimensions, for reference and use with FIGS. 30-39.

Figure 30:
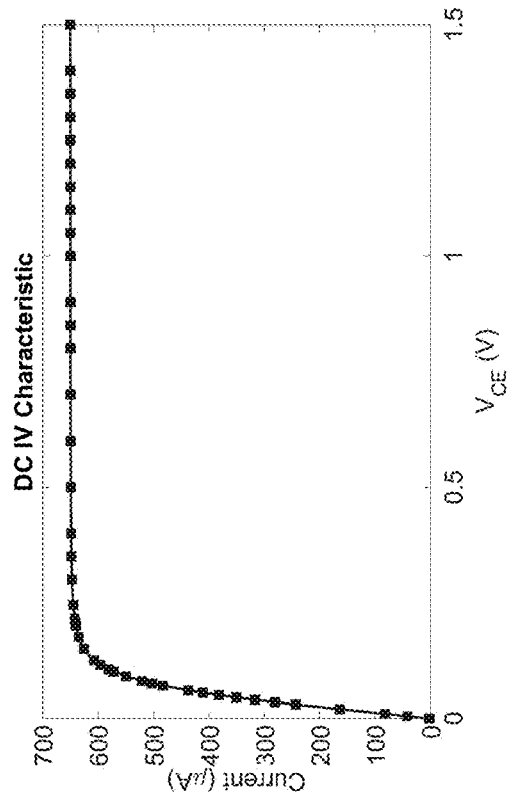
Figure 32:
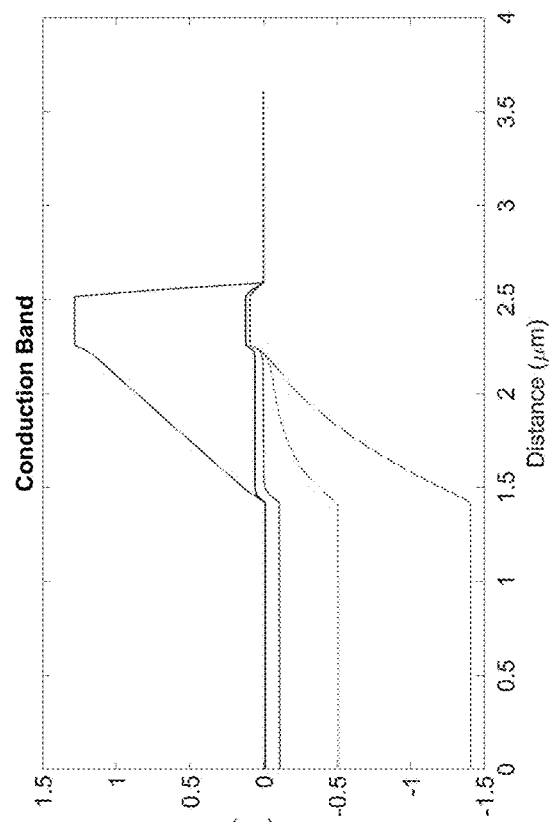
Figure 31:
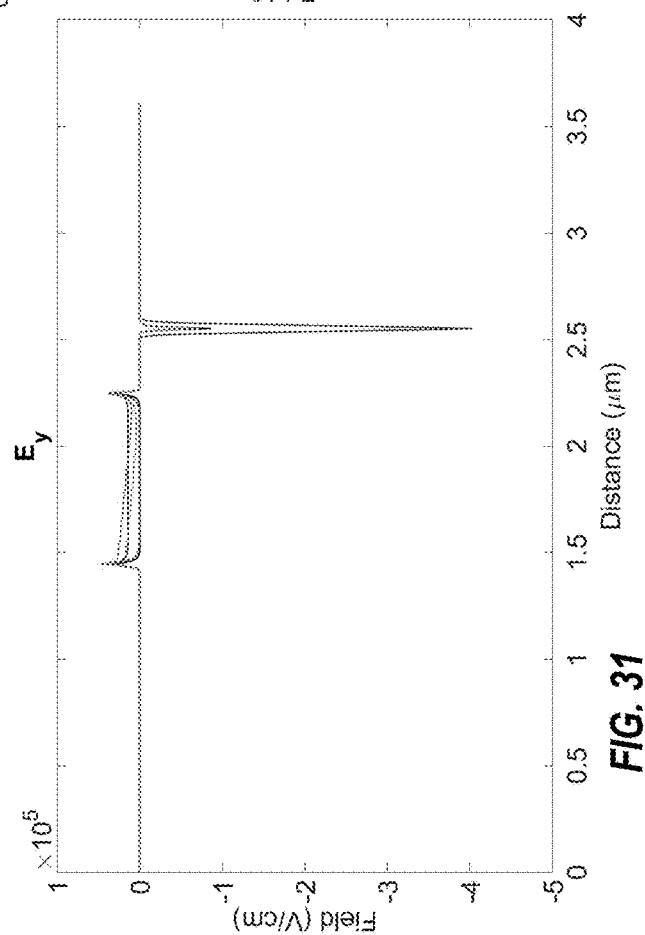

FIGS. 30-32 are graphs of a baseline photo response for the NPIN modulator 30 in. FIG. 30 is a graph of DC IV characteristic, FIG. 31 is a graph of the electric field, and FIG. 32 is a graph of the conduction band. It takes only ~10 meV to forward bias B-E diode. At ~300 meV, photocurrent saturates at $\beta_{max}$=97.

Figure 33:
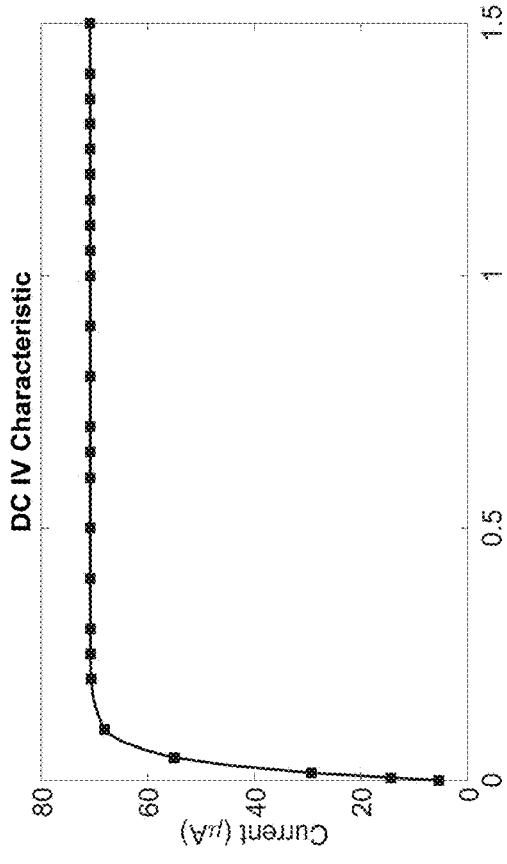
FIGS. 33-35 are graphs of the effects of reducing emitter doping.
Figure 35:
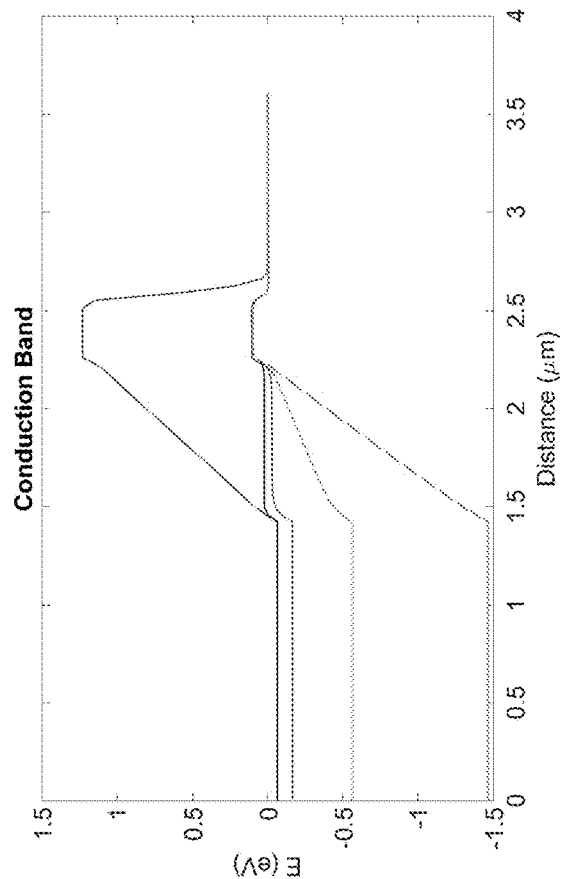
Figure 34:
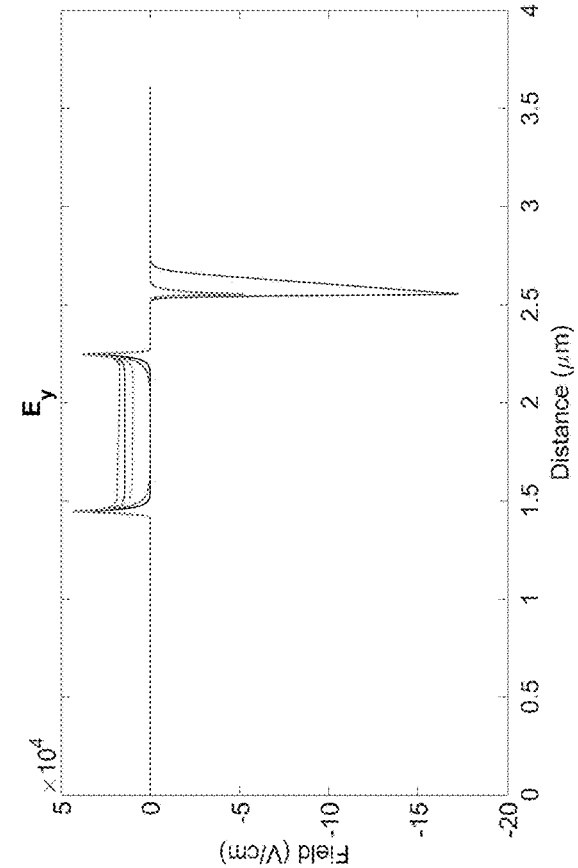

FIGS. 33-35 are graphs of the effects of reducing emitter doping. FIG. 33 is a graph of DC IV characteristic, FIG. 34 is a graph of the electric field, and FIG. 35 is a graph of the conduction band. By reducing the emitter doping to 1E17, $\beta_{max}$ will decrease to ~10. Moreover, field distribution in the intrinsic region resembles closer to that of an ideal PIN.

FIGS. 36-38 are graphs of the effects of widening the base. FIG. 36 is a graph of DC IV characteristic, FIG. 37 is a graph of the electric field, and FIG. 38 is a graph of the conduction band. $\beta_{max}$ may be reduced to ~13 by widening the base (1000 nm).

Figure 39:
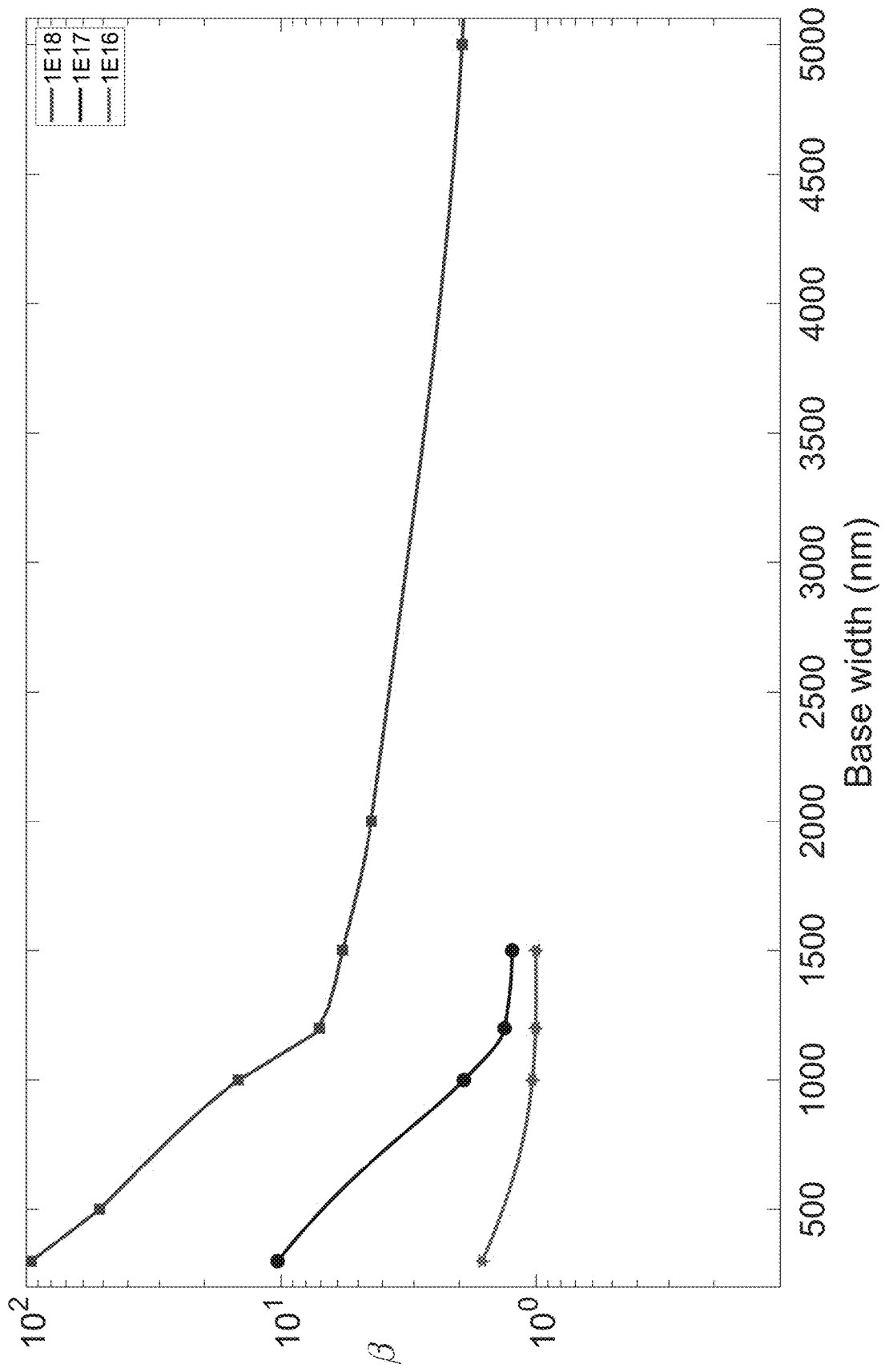
FIG. 39 is a graph of variation of $\beta$ versus Emitter Doping and Base Width.

FIG. 39 is a graph of variation of β versus Emitter Doping and Base Width.

Heterojunction NPIN Photo Response

Figure 40:
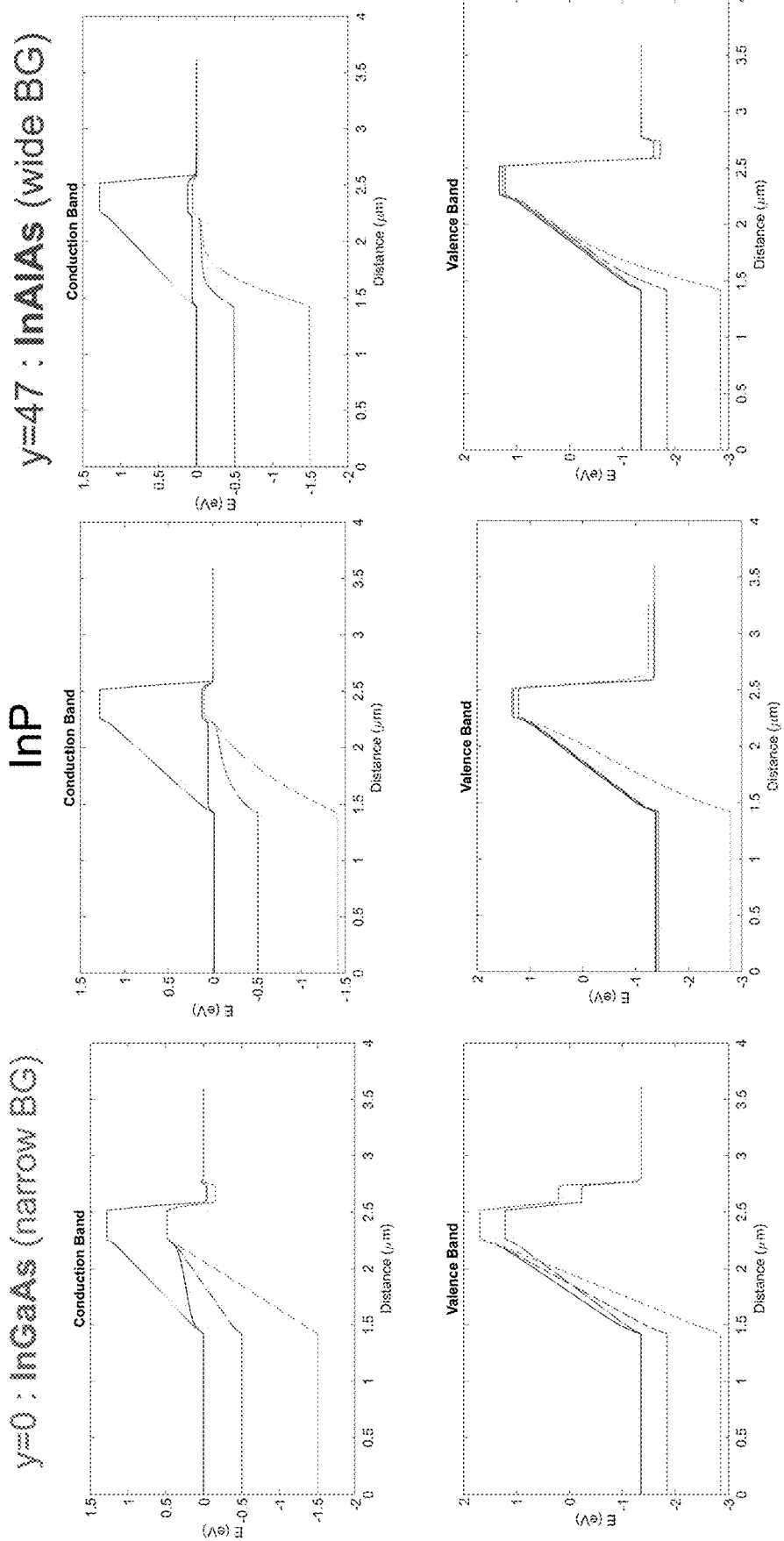
FIG. 40 is various graphs for InGaAs (narrow bandgap), InP, and InAlAs (wide bandgap) illustrating the conduction band and the valence band.

This section demonstrates the relationship between bandgap of the proposed emitter layer and photocurrent amplification. The primary conclusions include
 A narrow band-gap emitter will greatly suppress unwanted amplification
 A large band-gap emitter will enhance unwanted amplification
 The specific material choice represents a trade-off between electrical and optical performance FIG. 40 is various graphs for InGaAs (narrow bandgap), InP, and InAlAs (wide bandgap) illustrating the conduction band and the valence band.

Figure 41:
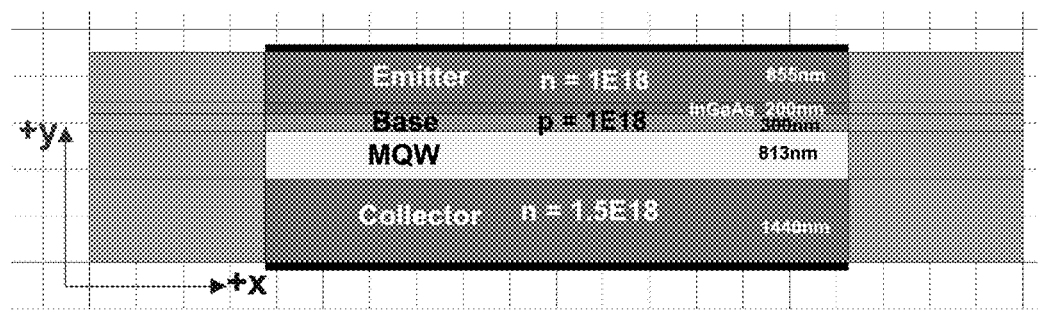
FIG. 41 is a diagram of a physical layout of the NPIN modulator 50 in the y and x dimensions, for reference and use with FIGS. 42-59.

FIG. 41 is a diagram of a physical layout of the NPIN modulator 50 in the y and x dimensions, for reference and use with FIGS. 42-59.

FIGS. 42-44 are graphs of the InGaAs—NPIN Photo response (Narrow BG Emitter). FIG. 42 is a graph of DC IV characteristic, FIG. 43 is a graph of the electric field, and FIG. 44 is a graph of the conduction band. $\beta_{max}$ is curbed at 1. E-field profile is not compromised in the MQW region. A narrower bandgap at emitter (relative to base) suppresses β.

FIGS. 45-47 are graphs of the InAlAs—NPIN Photo response (Wide BG Emitter). FIG. 45 is a graph of DC IV characteristic, FIG. 46 is a graph of the electric field, and FIG. 47 is a graph of the conduction band. $\beta_{max}$ is enhanced to 376. E-field profile in the MQW region is significantly compromised. A wider bandgap at emitter (relative to base) enhances β.

FIG. 48 is graphs of the heterostructure NPIN photo response. If x=0.47−y, then InGaAlAs is lattice matched to InP.

Figure 52:
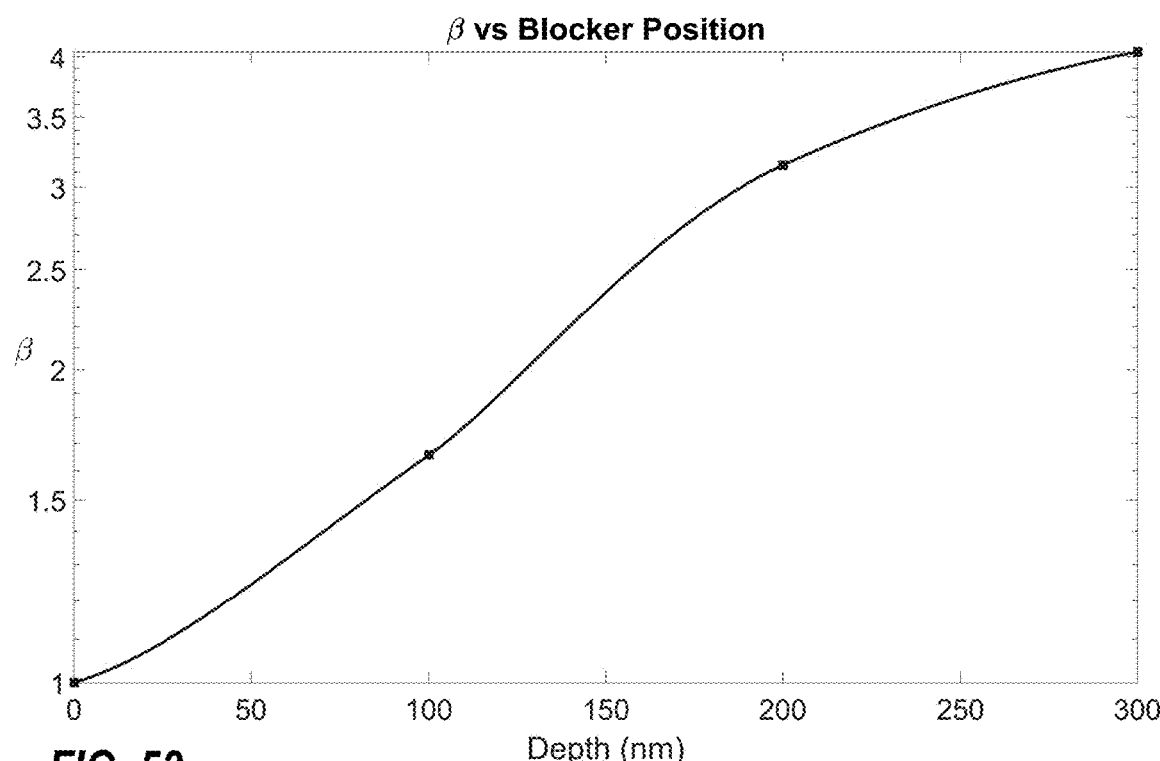
FIG. 52 is a graph of gain vs. blocking layer position.

FIGS. 49-51 are graphs of gain vs. blocking layer thickness and composition. FIG. 49 is a bandgap graph, FIG. 50 is a graph of β vs. blocker position, and FIG. 51 is a graph of β vs. blocking layer thickness. FIG. 52 is a graph of gain vs. blocking position.

Figure 53:
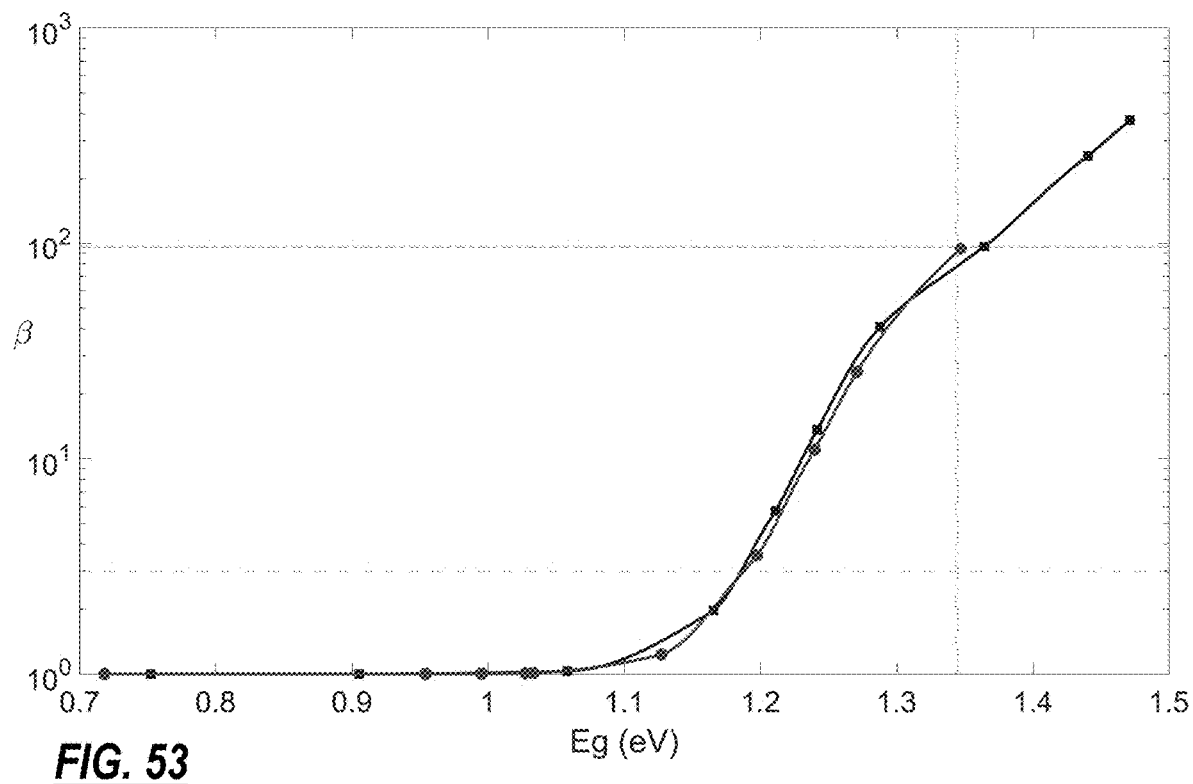
FIG. 53 is a graph of $\beta$ vs. bandgap energy.
Figure 54:
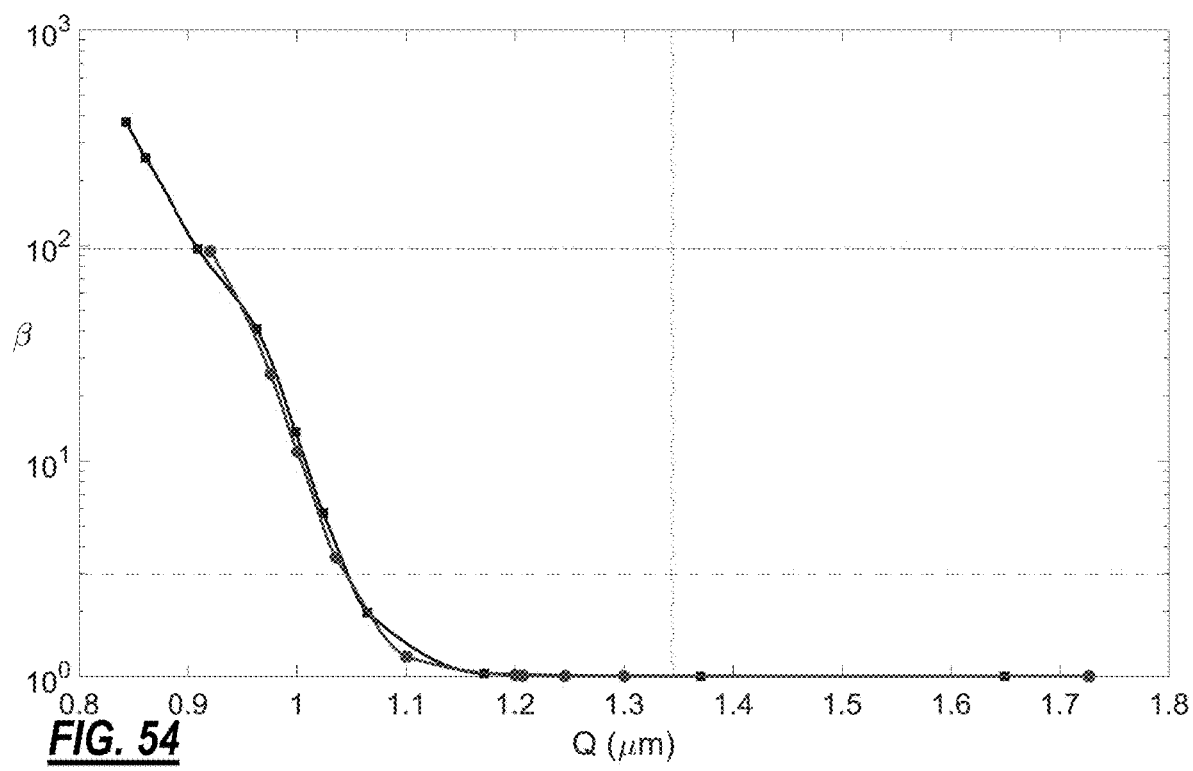
FIG. 54 is a graph of Q for InGaAlAs vs. InGaAsP as blocking layers.

FIG. 53 is a graph of electric field for InGaAlAs vs. InGaAsP as blocking layers. FIG. 54 is a graph of Q for InGaAlAs vs. InGaAsP as blocking layers.

For photocurrent calibration, Narrow bandgap (BG) @ Base leads to β enhanced, Narrow BG @ Emitter leads to β suppressed, and Wide BG @ Base leads to β being suppressed, but not as much. Due to fabrication and material constraints, this latter approach is not as effective in suppressing unwanted current as the solution described herein.

FIGS. 55-57 are graphs of the InAlAs—NPIN Photo response (Wide BG Base). FIG. 55 is a graph of DC IV characteristic, FIG. 56 is a graph of the electric field, and FIG. 57 is a graph of the conduction band. $\beta_{max}$ is reduced to 3. E-field profile is slightly weakened in the MQW region. A narrower bandgap at emitter (relative to base) suppresses β.

Dependence of Band Offset on Temperature in a Simple Hetero-Junction

A simulation to assess device sensitivity to temperature; product operates at 320 K while most simulations were conducted at 300K. This depicts photocurrent amplification as a function of emitter band-gap at three temperatures. The suppression mechanism is robust up to 350K for materials with bandgaps in the 1.1 to 1.2 μm range.

Figure 58:
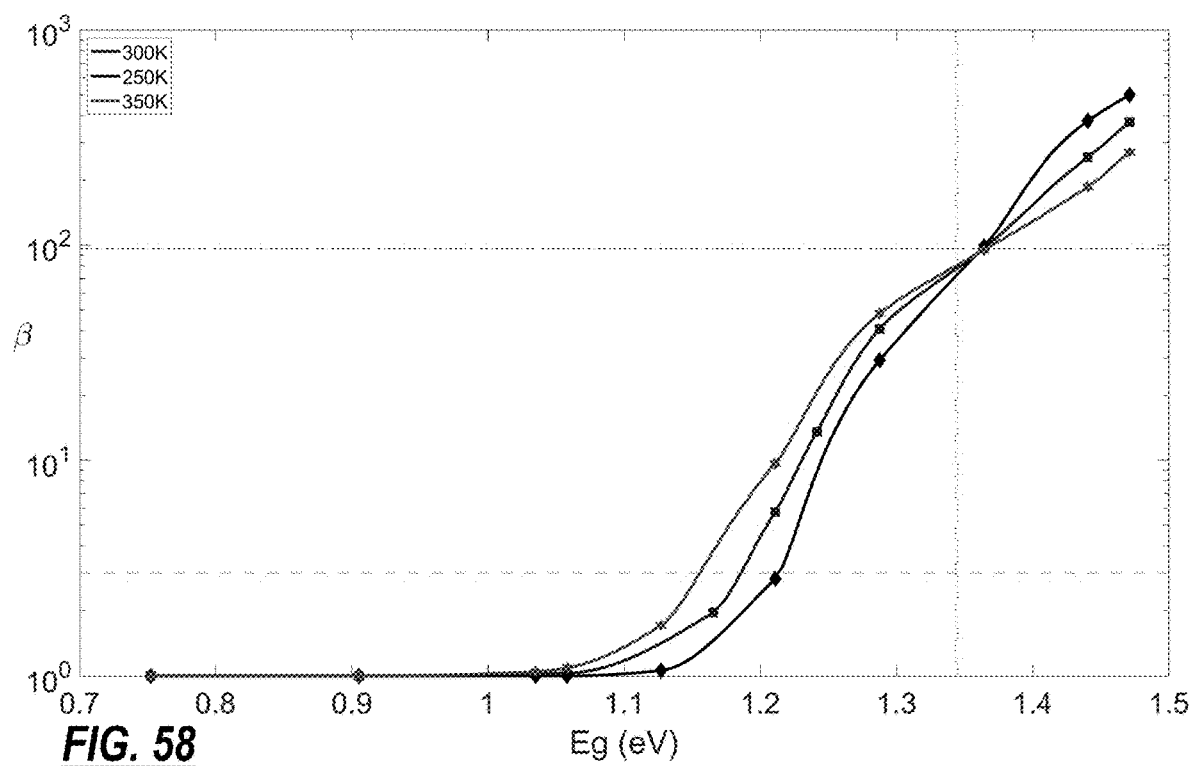
FIG. 58 is a Photo-amplification vs. sub-emitter bandgap for three different temperatures [Eg=bandgap energy].
Figure 59:
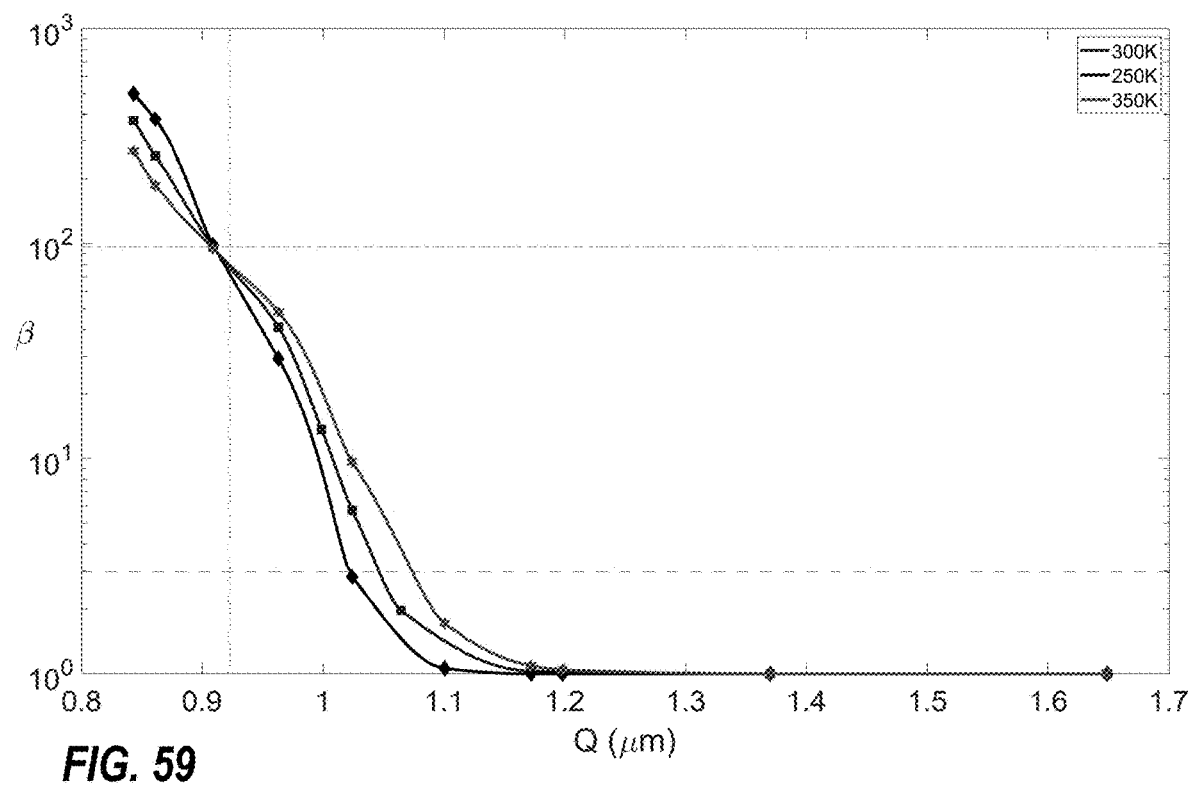
FIG. 59 is a graph of Q for different temperatures.

FIG. 58 is a graph of current amplification vs sub-emitter band gap for three different temperatures. FIG. 59 represents the same thing as FIG. 58, but the bandgap is measured in terms of its wavelength (Q) instead of eV.

Non-Idealities in Fabricated Devices

The preceding sections focus on vertical current flow of a NPIN structure; fabricated devices are finite and need to be terminated. This section depicts expectations for the edge of fabricated devices and considers whether non-idealities will degrade or destroy the advantage of the proposed approach. The models predict that performance is insensitive to anticipated issues. This conclusion is drawn from a simulation of a conventional PIN structure as a baseline for subsequent results and a simulation of proposed NPIN structure while varying the geometry of the proposed narrow band-gap layer.

Figure 60:
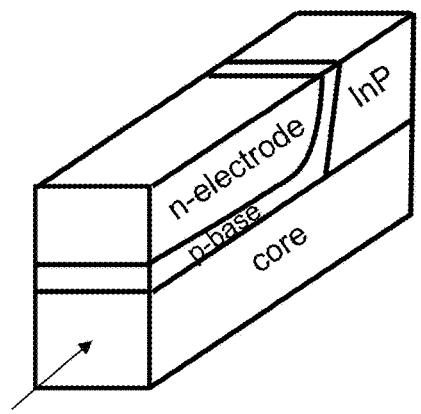
FIG. 60 is a perspective diagram of the edge region of a fabrication NPIN structure.
Figure 61:
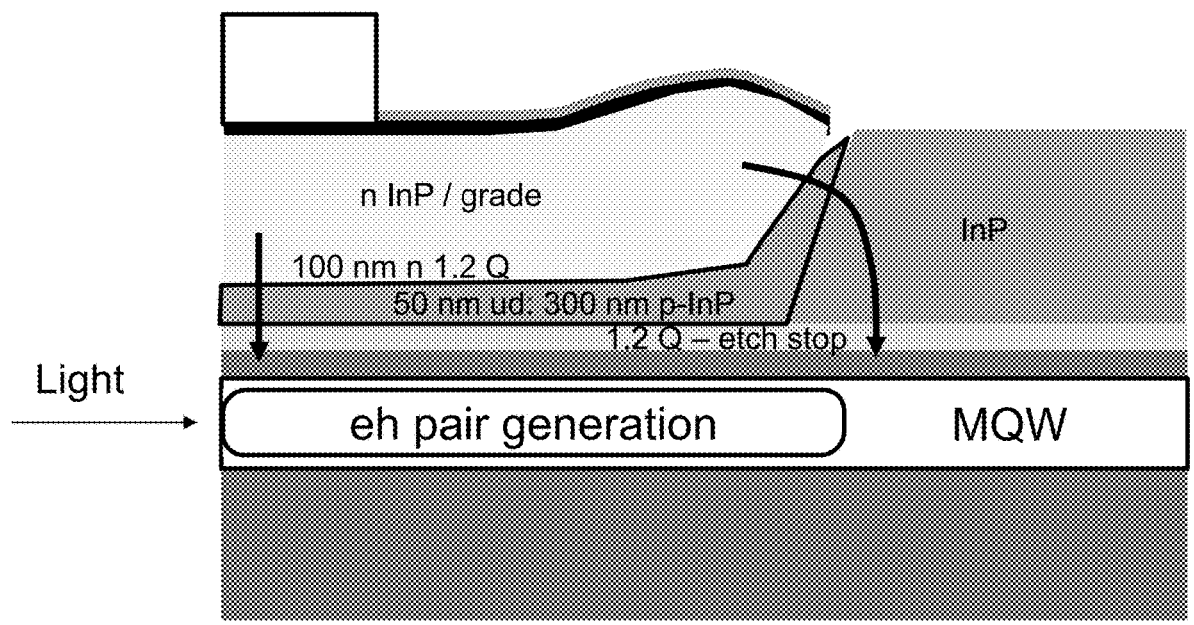
FIG. 61 is a cross sectional diagram of the edge region of a fabrication NPIN structure.

FIG. 60 is a perspective diagram of the edge region of a fabrication NPIN structure. FIG. 61 is a cross sectional diagram of the edge region of a fabrication NPIN structure. There are two NPIN devices: (i) The primary vertical structure, and (ii) a parasitic structure at the edge of the device. The narrow band-gap material may not cover the entire sidewall leading to a question of whether there would be elevated leakage.

Figure 62:
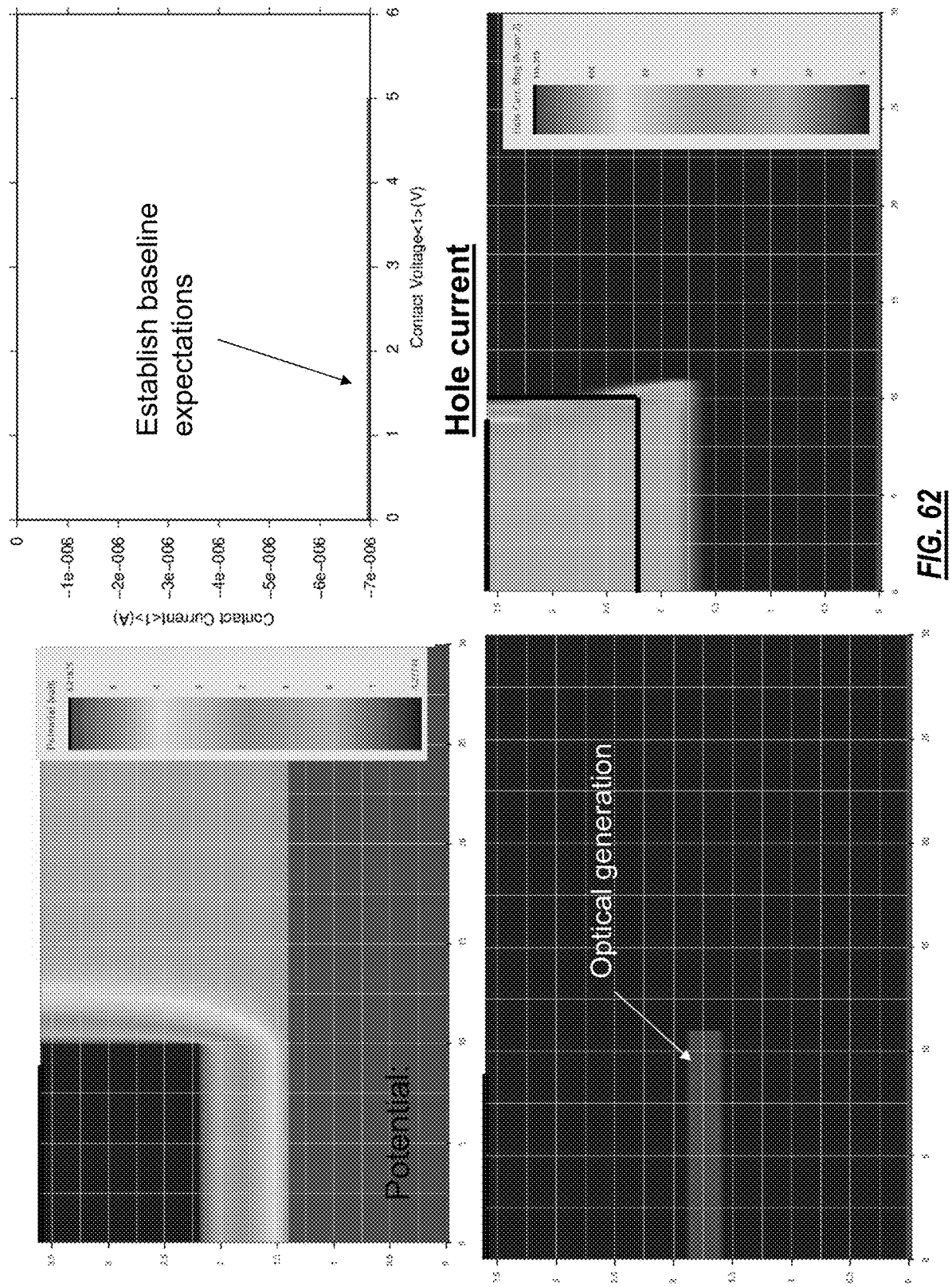
FIG. 62 is graphs of a simulation of a conventional 2D PIN Edge.
Figure 63:
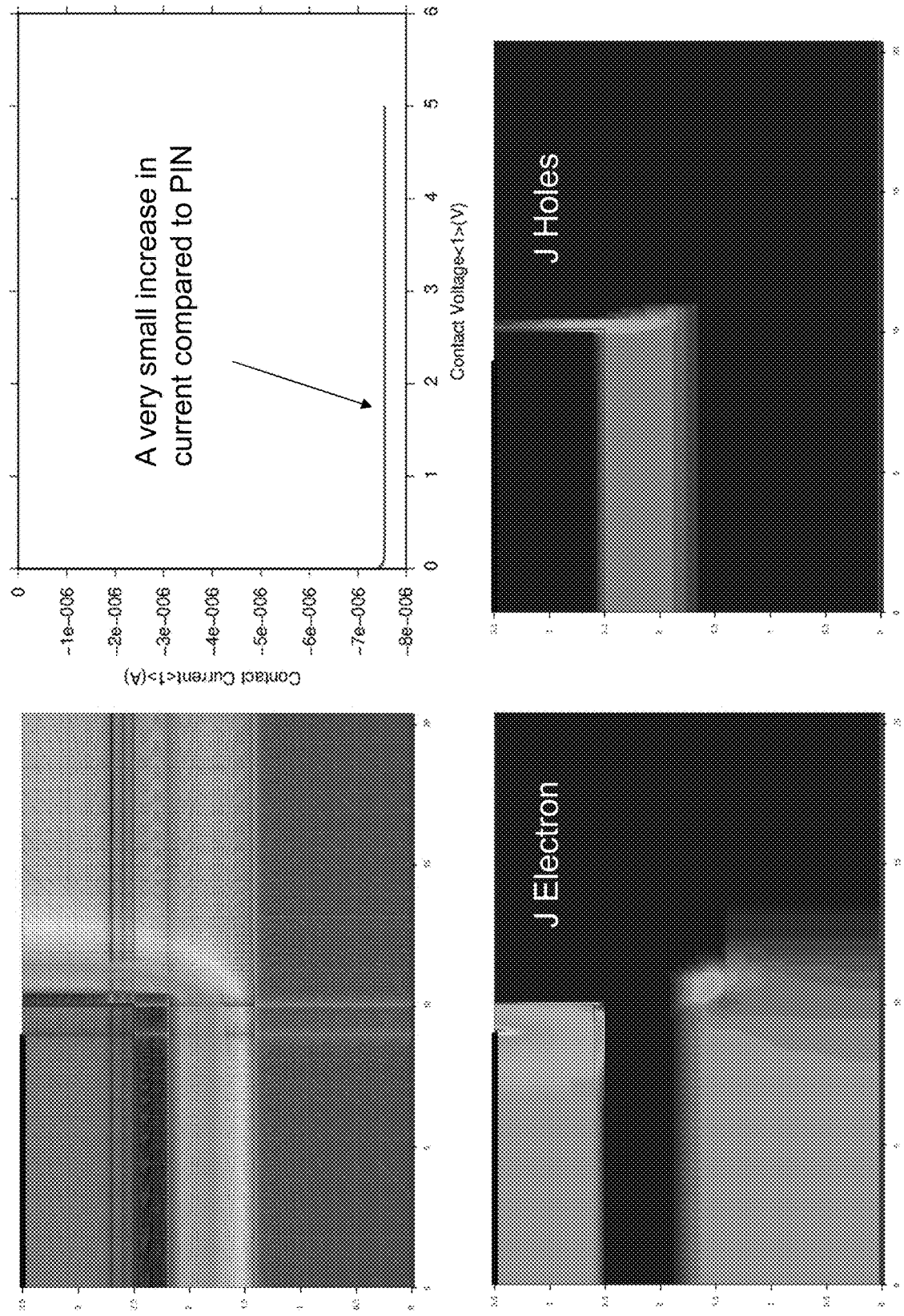
FIG. 63 is graphs of a NPIN with 1.2Q—with a complete sidewall.
Figure 64:
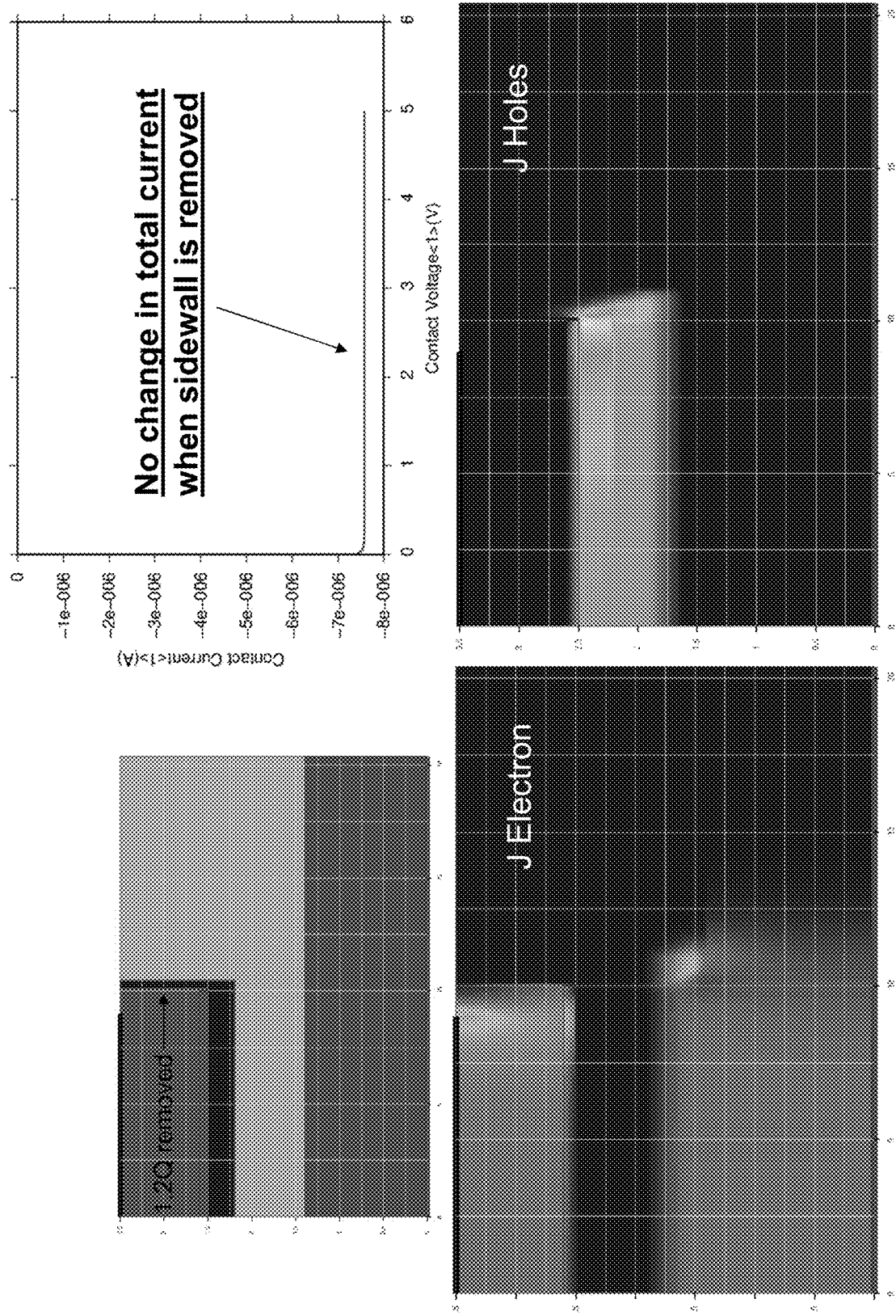
FIG. 64 is graphs of a NPIN with 1.2Q with the sidewall removed.

FIG. 62 is graphs of a simulation of a conventional 2D PIN Edge. FIG. 63 is graphs of a NPIN with 1.2Q—with a complete sidewall. FIG. 64 is graphs of a NPIN with 1.2Q with the sidewall removed. FIG. 65 is graphs of NPIN current as 1.2Q sidewall is pulled back.

Figure 66:
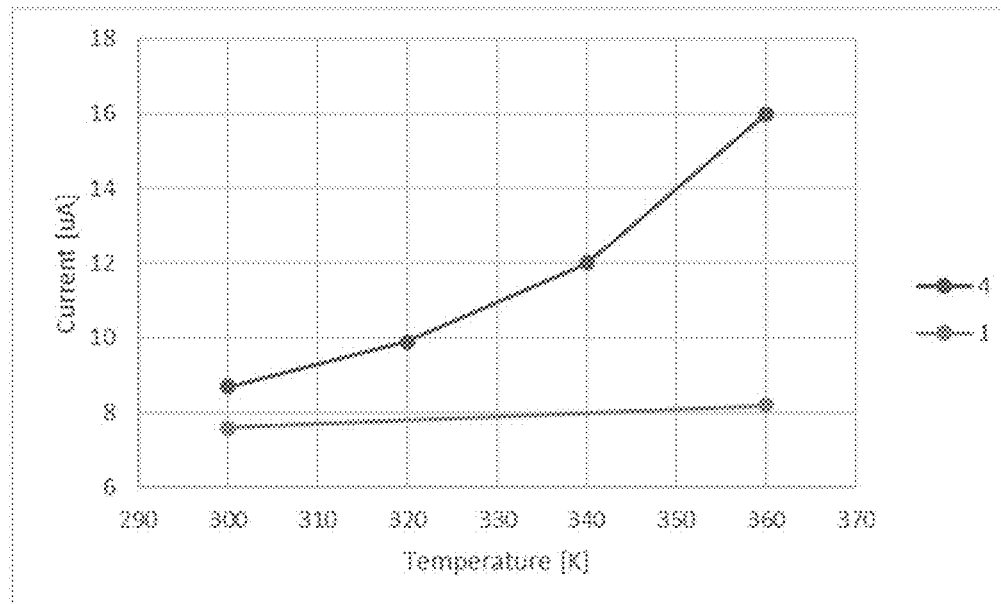
FIG. 66 is a graph of sensitivity showing current increase with temperature; for variable pullback.
Figure 67:
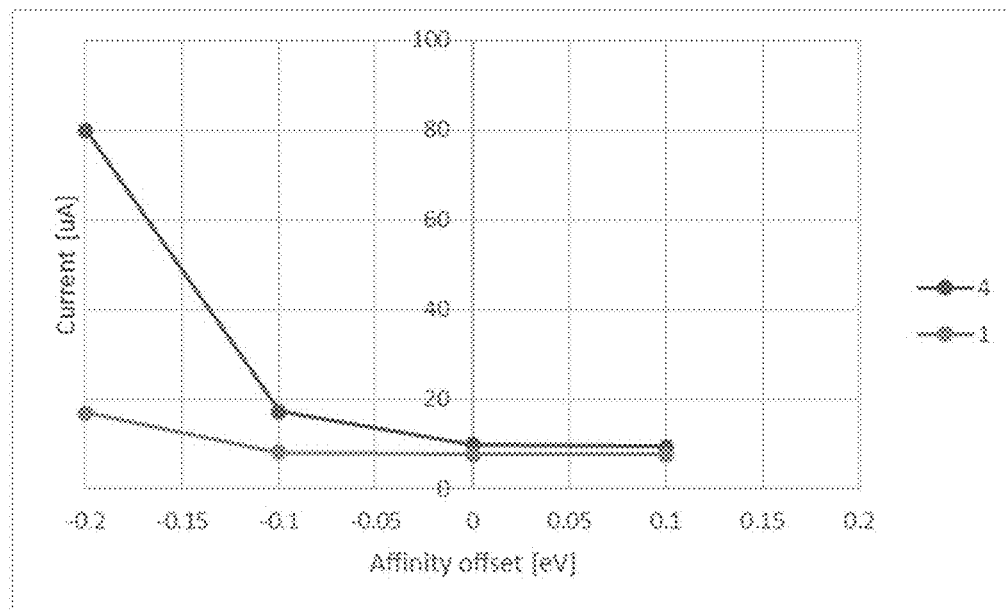
FIG. 67 is a graph of sensitivity showing Current vs. affinity offset; variable pullback; at 320K.

FIG. 66 is a graph of sensitivity showing current increase with temperature; for variable pullback. FIG. 67 is a graph of sensitivity showing Current vs. affinity offset; variable pullback; at 320K.

CONCLUSION

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. An optical modulator comprising:
an emitter layer with N-type doping having a first bandgap energy;
a base layer with P-type doping having a second bandgap energy;
a sub-emitter layer disposed between the emitter layer and the base layer, wherein the sub-emitter layer has a third bandgap energy that is less than both the first bandgap energy and the second bandgap energy;
a collector layer having n-type doping; and
an undoped layer disposed between the collector layer and the base layer, wherein the undoped layer is configured to have light propagate through the undoped region for modulation thereof.

2. The optical modulator of claim 1, wherein the optical modulator includes an NPIN junction.

3. The optical modulator of claim 1, wherein the optical modulator includes an NIPN junction.

4. The optical modulator of claim 1, wherein the sub-emitter layer provides a barrier to electrons flowing from the emitter layer, while allowing photo-generated holes to recombine in the sub-emitter layer thereby mitigating current amplification.

5. The optical modulator of claim 1, further comprising a first contact disposed to the emitter layer; and
a second contact disposed to the collector layer.

6. The optical modulator of claim 1, wherein the third bandgap energy is about 1.1 to 1.2 Q where Q is bandgap measured in μm.

7. The optical modulator of claim 1, wherein the third bandgap energy is about 1.2 Q where Q is bandgap measured in μm.

8. The optical modulator of claim 1, wherein the optical modulator is fabricated from III-V semiconductors.

9. The optical modulator of claim 1, wherein the sub-emitter layer includes a quaternary alloy that is either P-based or Al-based.

10. A method of forming an optical modulator comprising steps of:
forming an emitter layer with N-type doping having a first bandgap energy;
forming a base layer with P-type doping having a second bandgap energy;
forming a sub-emitter layer disposed between the emitter layer and the base layer, wherein the sub-emitter layer has a third bandgap energy that is less than both the first bandgap energy and the second bandgap energy;
forming a collector layer having n-type doping; and
forming an undoped layer disposed between the collector layer and the base layer, wherein the undoped layer is configured to have light propagate through the undoped region for modulation thereof.

11. The method of claim 10, wherein the optical modulator includes an NPIN junction.

12. The method of claim 10, wherein the optical modulator includes an NIPN junction.

13. The method of claim 10, wherein the sub-emitter layer provides a barrier to electrons flowing from the emitter layer, while allowing photo-generated holes to recombine in the sub-emitter layer thereby mitigating current amplification.

14. The method of claim 10, wherein the steps further include
forming a first contact disposed to the emitter layer; and
forming a second contact disposed to the collector layer.

15. The method of claim 10, wherein the third bandgap energy is about 1.1 to 1.2 Q where Q is bandgap measured in μm.

16. The method of claim 10, wherein the third bandgap energy is about 1.2 Q where Q is bandgap measured in μm.

17. The method of claim 10, wherein the optical modulator is fabricated from III-V semiconductors.

18. The method of claim 10, wherein the sub-emitter layer includes a quaternary alloy that is either P-based or Al-based.

* * * * *